US009052409B2

(12) United States Patent
Prange et al.

(10) Patent No.: US 9,052,409 B2
(45) Date of Patent: Jun. 9, 2015

(54) MONTE CARLO METHOD FOR LAPLACE INVERSION OF NMR DATA

(75) Inventors: Michael Prange, Somerville, MA (US); Yi-Qiao Song, Newton Center, MA (US)

(73) Assignee: Schlumberger Technology Corporation, Cambridge, MA (US)

(*) Notice: Subject to any disclaimer, the term of this patent is extended or adjusted under 35 U.S.C. 154(b) by 47 days.

(21) Appl. No.: 12/172,172

(22) Filed: Jul. 11, 2008

(65) Prior Publication Data
US 2010/0010744 A1 Jan. 14, 2010

(51) Int. Cl.
*G01V 3/32* (2006.01)
*G01V 3/14* (2006.01)
*G01V 3/18* (2006.01)
*G01R 33/483* (2006.01)

(52) U.S. Cl.
CPC ... *G01V 3/32* (2013.01); *G01V 3/18* (2013.01); *G01R 33/483* (2013.01); *G01V 3/14* (2013.01)

(58) Field of Classification Search
USPC .............................. 324/300–322; 702/2, 7, 19; 382/128–131; 600/407–435
See application file for complete search history.

(56) References Cited

U.S. PATENT DOCUMENTS

| 4,287,418 | A | * | 9/1981 | Divin et al. ................. 250/336.1 |
| 4,761,545 | A | * | 8/1988 | Marshall et al. .............. 250/291 |
| 5,023,551 | A | | 6/1991 | Kleinberg et al. |
| 5,291,137 | A | | 3/1994 | Freedman |
| 5,486,762 | A | * | 1/1996 | Freedman et al. ............. 324/303 |
| 5,572,125 | A | * | 11/1996 | Dunkel ......................... 324/307 |
| 6,023,634 | A | * | 2/2000 | Hanawa et al. ................ 600/410 |
| 6,040,696 | A | * | 3/2000 | Ramakrishnan et al. ...... 324/303 |
| 6,084,408 | A | * | 7/2000 | Chen et al. .................... 324/303 |
| 6,229,308 | B1 | * | 5/2001 | Freedman ..................... 324/303 |
| 6,344,744 | B2 | | 2/2002 | Taicher et al. |
| 6,377,042 | B1 | * | 4/2002 | Menger et al. ................ 324/303 |
| 6,462,542 | B1 | | 10/2002 | Venkataramanan et al. |
| 6,570,382 | B1 | | 5/2003 | Hurlimann et al. |
| 6,714,009 | B2 | * | 3/2004 | Heidler ........................ 324/303 |
| 6,765,380 | B2 | | 7/2004 | Freedman et al. |
| 6,828,875 | B2 | | 12/2004 | Channabasappa et al. |

(Continued)

FOREIGN PATENT DOCUMENTS

| CA | 2730512 | A1 | * | 1/2010 |
| GB | 2474385 | A | * | 4/2011 |

(Continued)

OTHER PUBLICATIONS

Borgia et al, "Uniform-penalty inversion of multiexponential decay data", Journal of Magnetic Resonance, 132, pp. 65-77, 1998.

(Continued)

*Primary Examiner* — Melissa Koval
*Assistant Examiner* — Tiffany Fetzner
(74) *Attorney, Agent, or Firm* — Jakub Michna

(57) ABSTRACT

Methods and related systems are described for extracting information about a system of nuclear spins including: performing a plurality of Nuclear Magnetic Resonance (NMR) measurements on the system of nuclear spins; acquiring NMR data from each of the plurality of NMR measurements; performing data inversion using an random-sampler to generate an ensemble of spectra so as to extract information about the system of nuclear spins; and analyzing the performed random-sampler inversion results to extract information about the system of nuclear spins.

26 Claims, 13 Drawing Sheets

(56) References Cited

U.S. PATENT DOCUMENTS

| | | | |
|---|---|---|---|
| 6,838,875 B2 | 1/2005 | Freedman | |
| 6,847,737 B1* | 1/2005 | Kouri et al. | 382/260 |
| 6,850,793 B1* | 2/2005 | Miyazaki et al. | 600/410 |
| 6,859,033 B2* | 2/2005 | Speier | 324/303 |
| 6,960,913 B2 | 11/2005 | Heaton | |
| 7,272,265 B2* | 9/2007 | Kouri et al. | 382/260 |
| 7,298,142 B2 | 11/2007 | Hursan et al. | |
| 7,348,776 B1* | 3/2008 | Aksoy et al. | 324/307 |
| 7,526,413 B2* | 4/2009 | Dahlberg | 703/2 |
| 7,672,790 B2* | 3/2010 | McGraw et al. | 702/19 |
| 8,206,302 B2* | 6/2012 | Zhang et al. | 600/453 |
| 2003/0214286 A1* | 11/2003 | Heidler | 324/303 |
| 2004/0041562 A1* | 3/2004 | Speier | 324/303 |
| 2004/0071363 A1* | 4/2004 | Kouri et al. | 382/276 |
| 2006/0290350 A1 | 12/2006 | Hursan et al. | |
| 2008/0054899 A1* | 3/2008 | Aksoy et al. | 324/307 |
| 2008/0109171 A1* | 5/2008 | McGraw et al. | 702/19 |
| 2010/0010744 A1* | 1/2010 | Prange et al. | 702/7 |

FOREIGN PATENT DOCUMENTS

| | | | |
|---|---|---|---|
| GB | 2474385 B | * | 12/2012 |
| NO | 201100236 A | * | 4/2011 |
| WO | WO 2010006329 A2 | * | 1/2010 |
| WO | WO 2010006329 A3 | * | 4/2010 |

OTHER PUBLICATIONS

Fordham et al, "Imaging multiexponential relaxation in the (y, loge t1) Plane, with application to clay filtration in rock cores", Journal of Magnetic Resonance Series A 113, pp. 139-150, 1995.

John Geweke, "Efficient simulation from the multivariate normal and student-t distributions subject to linear constraints", Constrained Multivariate Normal Simulation, Computing Scient and Statistics, Proceedings of the 23rd Symposium on the Interface, Seattle Washington, Apr. 21-24, 1991, pp. 571-576.

W.E. Kenyon, "Nuclear Magnetic Resonance as a Petrophysical Measurement", Nucl. Geophys., vol. 6, No. 2, pp. 153-171, 1992.

Robert Kleinberg, "Well Logging", Encyclopedia of Nuclear Magnetic Resonance, vol. 8, Tis-Z Indexes, John Wiley & Sons, 1996, pp. 4960-4969.

Lawson et al, "Linear Least Squares with Linear Inequality Constraints", Solving Least Squares Problems, Prentice-Halle, Inc., Englewood Cliffs, NJ, 1974, pp. 158-166.

Parker et al, "Assigning uncertainties in the inversion of NMR relaxation data", Journal of Magnetic Resonance 174, 2005, pp. 314-324.

Philippe et al, "Perfect simulation of positive gaussian distributions", Statistics and Computing 13: pp. 179-186, 2003.

Stephen Provencher, "CONTIN: a general purpose constrained regularization program for inverting noisy linear algebraic and integral equations" Computer Physics Communications 27, 1982, pp. 229-242.

Robert et al, "The multi-stage gibbs sample", Monte Carlo Statistical methods, 2nd ed., Chapter 10, 2004, pp. 371-424.

Rodriguez-Yam et al, "Efficient gibbs sampling of truncated multivariate normal with application to constrained linear regression", Technical Report, Colorado State University, 2004, 30 pages.

John Skilling, "Classic maximum entropy", Maximum Entropy and Bayesian Methods, Cambridge, England, 1988, Kluwer Academic Publishers, pp. 45-52.

Stephen Gull, "Developments in maximum entropy data analysis", Maximum Entropy and Bayesian Methods, Cambridge, England, 1988, Kluwer Academic Publishers, pp. 53-71.

Yi-Qiao Song, "Novel Two Dimensional NMR of diffusion and relaxation for material", NMR Imaging in Chemical Engineering, Wiley-VCH 2005, pp. 163-183.

Song et al, "T1-T2 correlation spectra obtained using a fast two-dimensional laplace inversion", Journal of Magnetic Resonance, 154, pp. 261-268, 2002.

Tikhonov et al, "The regularization Method", Solutions of III-Posed Problems, CH 11, John Wiley & Sons, 1977, pp. 45-94.

International Search Report of PCT Application No. PCT/US2009/050387 dated Feb. 3, 2010: pp. 1-4.

Krilov et al., "Quantum time correlation functions from complex time Monte Carlo simulations: A maximum entropy approach," Journal of Chemical Physics, Jan. 2001, vol. 114(3): pp. 1075-1088.

* cited by examiner

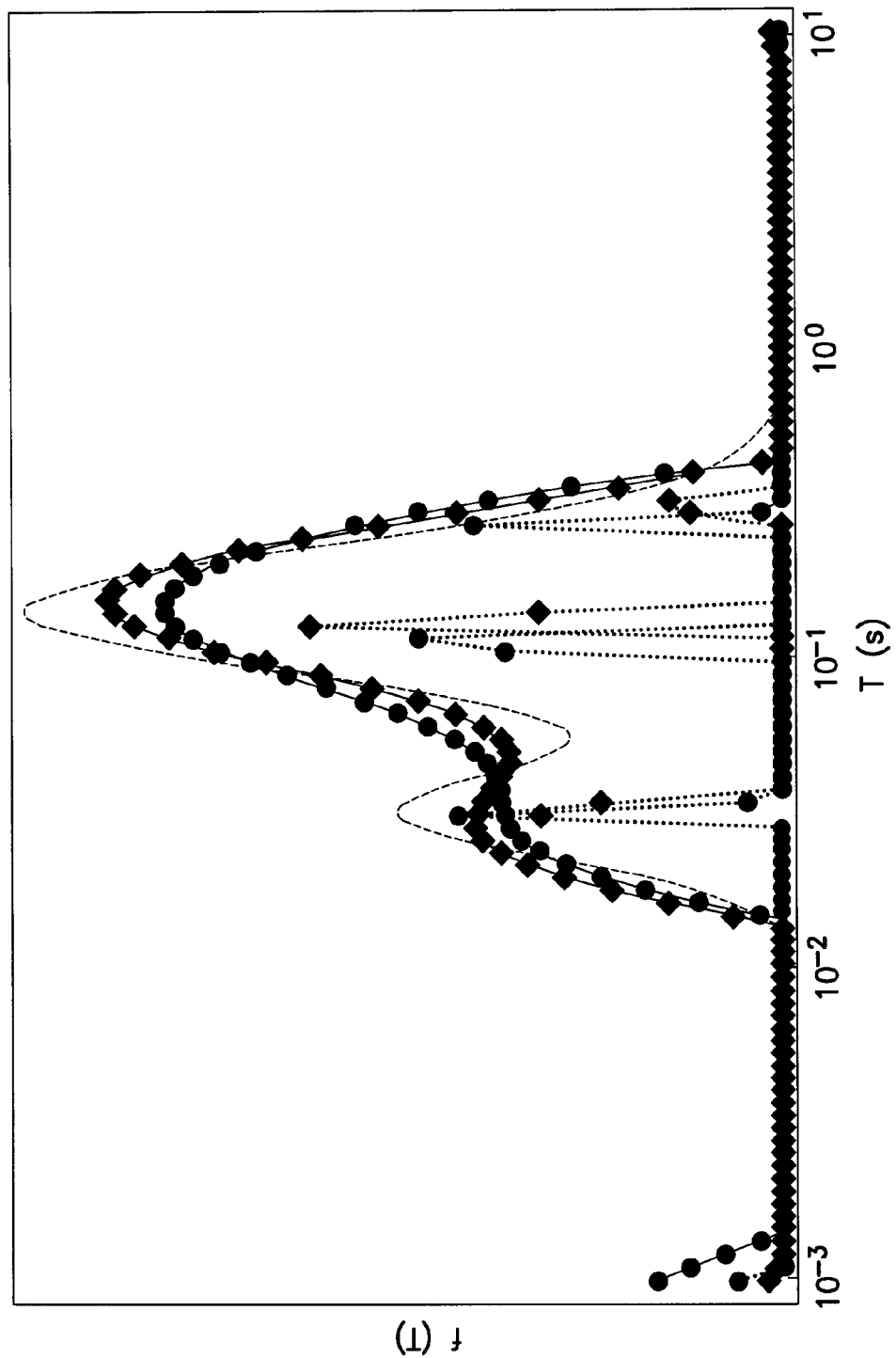

MONTE CARLO METHOD FOR LAPLACE INVERSION OF NMR DATA

BACKGROUND OF THE INVENTION

1. Field of the Invention

This invention is generally related to methods and systems relating to nuclear magnetic resonance (NMR) measurements and, more particularly, analysis of NMR data using in part a Monte Carlo sampler (or random sampler) that maybe used in oilfield operations.

2. Background of the Invention

Nuclear magnetic resonance (NMR) has been a known laboratory technique and has become an important tool in formation evaluation. NMR well logging background information can be found, for example, in U.S. Pat. No. 5,023,551 to Kleinberg et al., is incorporated herein by reference in its entirety.

In reviewing aspects of NMR, it is known that NMR relies upon the fact that the nuclei of many chemical elements have angular momentum ("spin") and a magnetic moment. In an externally applied static magnetic field, the spins of nuclei align themselves along the direction of the static field. This equilibrium situation can be disturbed by a pulse of an oscillating magnetic field (e.g., a RF pulse) that tips the spins away from the static field direction. The angle through which the spins are tipped is given by $\theta = \gamma B_1 t_p/2$, where $\gamma$ is the gyromagnetic ratio, $B_1$ is the linearly polarized oscillating field strength, and $t_p$ is the duration of the pulse. Tipping pulses of ninety and one hundred eighty degrees are most common.

It is noted after tipping, two things occur simultaneously. First, the spins process around the direction of the static field at the Larmor frequency, given by $\omega_0 = \gamma B_0$, where $B_0$ is the strength of the static field and $\gamma$ is the gyromagnetic ratio. For hydrogen nuclei, $\gamma/2\pi = 4258$ Hz/Gauss, so, for example, in a static field of 235 Gauss, the hydrogen spins would process at a frequency of 1 MHz. Second, the spins return to the equilibrium direction according to a decay time, $T_1$, which is known as the spin-lattice relaxation time. Because this spin-lattice relaxation occurs along the equilibrium direction, $T_1$ is also referred to as the longitudinal relaxation time constant.

Also associated with the spin of molecular nuclei is a second relaxation time, $T_2$, called the spin-spin relaxation time. At the end of a ninety-degree tipping pulse, all the spins are pointed in a common direction perpendicular, or transverse, to the static field, and they all process at the Larmor frequency. However, because of small fluctuations in the static field induced by other spins or paramagnetic impurities, the spins process at slightly different frequencies, and the transverse magnetization dephases with a time constant $T_2$, which is also referred to as the transverse relaxation time constant.

A standard technique for measuring $T_2$, both in the laboratory and in well logging, uses a RF pulse sequence known as the CPMG (Carr-Purcell-Meiboom-Gill) sequence. As is well known, after a wait time that precedes each pulse sequence, a ninety-degree pulse tips the spins into the transverse plane and causes the spins to start processing. Then, a one hundred eighty-degree pulse is applied that keeps the spins in the measurement plane, but causes the spins, which are dephasing in the transverse plane, to reverse direction and to refocus. By repeatedly reversing the spins using a series of one hundred eighty degree pulses, a series of "spin echoes" appear. The train of echoes is measured and processed to determine the irreversible dephasing time constant, $T_2$. In well logging applications, the detected spin echoes have been used to extract oilfield parameters such as porosity, pore size distribution, and oil viscosity.

In theory, other laboratory NMR measurements may be applied in well-logging to extract additional information about the oilfield, but in practice, the nature of well-logging and the borehole environment make implementing some laboratory NMR measurements difficult. For example, inversion recovery is a common laboratory technique for measuring $T_1$. In an inversion recovery measurement, a one-hundred eighty degree pulse is applied to a system of spins aligned along the static magnetic field in order to reverse the direction of the spins. The system of spins thus perturbed begins to decay toward their equilibrium direction according to $T_1$. To measure the net magnetization, a ninety-degree pulse is applied to rotate the spins into the transverse plane and so induce a measurable signal. The signal will begin to decay as the spins dephase in the transverse plane, but the initial amplitude of the signal depends on the "recovery time" between the one-hundred eighty degree pulse and the ninety-degree pulse. By repeating this experiment for different recovery times and plotting the initial amplitude of the signal against recovery time, $T_1$ may be determined. While this technique has been successfully used in the laboratory for several years, inversion recovery is very time consuming, and those of ordinary skill in the art recognize that inversion recovery may be unsuitable for well logging applications.

Other inversion algorithms are available for analyzing NMR well-logging data. The earliest methods provided one-dimensional $T_2$ (transverse relaxation time) spectra from single measurement data assuming multi-exponential decays. Examples of these methods include the "Windows Processing" scheme disclosed by Freedman (U.S. Pat. No. 5,291,137) and the "Uniform Penalty" method (Borgia, G. C. Brown, R. J. S. and Fantazzini, P., *J. Magn Reson.* 132, 65-77, 1998) Subsequently, acquisition schemes were devised comprising multiple measurements with different wait-times. Processing techniques were then introduced to analyze these measurements. One such method is disclosed by Freedman (U.S. Pat. No. 5,486,762).

U.S. Pat. No. 6,462,542 issued to Venkataramanan et al. and U.S. Pat. No. 6,570,382 issued to Hurlimann et al. are examples of other NMR methods developed to measure spin relaxation and diffusion in 1D measurements, 2D measurements, and multidimensional measurements. The measurement data is often analyzed by numerical Laplace inversion algorithm to obtain spectra of relaxation parameters, e.g. $T_1$ and $T_2$ and diffusion constant (D). For example, a 1D experiment (such as a CPMG measurement), $T_2$ spectrum is obtained. For a 2D experiment, a joint spectrum of two parameters (e.g. $T_1$-$T_2$, D-$T_2$) is obtained. Several algorithms have been published for 1D experiments, for example by: (1) S. W. Provencher, CONTIN: A General Purpose Constrained Regularization Program for Inverting Noisy Linear Algebraic and Integral Equations, Comput. Phys. Commun. 27, 229 (1982); (2) G. C. Borgia, R. J. S. Brown, and P. Fantazzini, Uniform-penalty Inversion of Multi-exponential Decay Data, J. Magn. Reson. 132, 65 (1998); and (3) E. J. Fordham, A. Sezginer, and L. D. Hall, Imaging ult-exponential Relaxation in the (y; log t1) plane, with application to clay Itration in rock cores, J. Magn. Reson. Ser. A 113, 139 (1995). However, these algorithms are not easily extended to handle 2D data set due to the huge requirement on computer memory.

U.S. Pat. No. 6,462,542 by Venkataramanan et al., discloses new measurement schemes such as "Diffusion Editing", in which the NMR data is substantially orthogonalized with regard to relaxation and diffusion attenuation, a processing technique based on a separable response kernel has been disclosed (see Venkataramanan, L., Song, Y-Q., and Hurlimann, M., U.S. Pat. No. 6,462,542). This method does not involve any model for the different fluid responses. Instead, it analyses the data in terms of unbiased spectra of relaxation times and diffusion rates. It is attractive in that it requires no a priori knowledge regarding the fluid properties and in favorable cases provides simple graphical results that are easily interpreted even by non-experts. A potential drawback of the inversion is that its accuracy is in part dependent upon the separability of the response kernels. This can limit the range of its applicability to measurements in which the NMR response is substantially orthogonalized in each of the measurement dimensions, for example, application of the method to multiple CPMG sequences with different inter-echo spacings.

Existing processing techniques also impose non-negativity constraints on the individual spectral amplitudes and typically require selection of at least one regularization (smoothing) parameter. The non-negativity condition, based on obvious physical grounds, renders those processing algorithms inherently non-linear. Although not a problem in principle, this places demands on the stability of the selected optimization procedure and caution must be exercised to ensure acceptable repeatability of inversion results for noisy data. The noise issue is addressed by use of the regularization parameter, which ensures that resulting spectra are smooth. However, selecting an appropriate value for the regularization parameter is not trivial. Despite the considerable body of published work addressing the question of regularization from a theoretical point of view (e.g. see references cited in Borgia, G. C. Brown, R. J. S. and Fantazzini, P., *J. Magn Reson.* 132, 65-77, (1998) and Venkataramanan, L., Song, Y-Q., and Hurlimann, M., U.S. Pat. No. 6,462,542), in practice regularization remains largely subjective, sometimes based only on the aesthetic appearance of the computed spectra. Regularization is of particular importance in multi-dimensional inversions, since the spectra are generally grossly underdetermined by the data and noise artifacts can easily result. In addition, different regions of the spectra display vastly different sensitivity to the input data. Failure to account for these variations in sensitivity can lead to false or unrealistic peaks in the spectra which can easily be misinterpreted.

The inversion of noisy NMR $T_2$ echo data of a $T_2$ spectrum is also widely recognized as an inherently non-unique process (see R. Parker, Y-Q Song, Assigning uncertainties in the Inversion of NMR Relaxation Data, J. Mag. Res. 174 (2005) 314-324.). An approach to quantifying this uncertainty is to use, for example, Monte Carlo sampling. Measurement noise is well described by an uncorrelated normal distribution. When combined with the non-negativity constraint on $T_2$ spectral values, this can lead to spectral values following a non-negative normal distribution. G. Rodriguez-Yam discloses samplers for truncated normal distributions of which non-negative normal samples are a subset, however their algorithms are grossly inefficient for the covariance matrices present in MNR $T_2$ spectral inversion (see G. Rodriguez-Yam et al., Efficient Gibbs' sampling of truncated multivariate normal with application to constrained linear regression, Technical Report, Colorado State University 2004). The reason for this and why it is not a practical method is that they are based on Gibbs' samplers that update the spectral estimate just one $T_2$ component at a time. When all of the spectral elements are fixed but one, that one has little room for change without violating the noise constraints on the data. This means that each spectral sample can only be slightly different from the preceding sample, indicating a high degree of statistical correlation and thus being an inappropriate solution due to the very slow convergence. Thus, what are needed are methods or systems that address all of the above noted problems and among other things, improve convergence as well as open the door for the inversion of 2D NMR spectra.

Accordingly, there continues to be a general need for improved NMR measurements and, in particular for the oil and gas exploration industries, improved NMR methods that can be used to extract information about rock samples and be used in well-logging applications.

SUMMARY OF INVENTION

According to an embodiment of the invention, a method of extracting information about a system of nuclear spins comprising: performing a plurality of Nuclear Magnetic Resonance (NMR) measurements on the system of nuclear spins; acquiring NMR data from each of the plurality of NMR measurements; performing data inversion using an random-sampler to generate an ensemble of spectra so as to extract information about the system of nuclear spins; and analyzing the performed random-sampler inversion results to extract information about the system of nuclear spins.

According to an aspect of the invention, the method includes the NMR data comprises NMR spin echoes.

According to an aspect of the invention, the method includes the NMR data from each of the plurality of NMR measurements are expressed as $M_r(\tau_1,\tau_2)=\iint k(\tau_1,\tau_2,x,y)f_r(x,y)dxdy+E_r(\tau_1,\tau_2)$, where $M_r(\tau_1,\tau_2)$ represents the NMR data; k represents the kernel function; $\tau_1$ and $\tau_2$ are a first and a second experimental parameters, respectively, associated with the NMR measurement; x and y are parameters related to the system of spins; $f_r(x,y)$ is a joint probability density function of x and y; and $E_r(\tau_1,\tau_2)$ represents noise associated with the NMR data.

According to an aspect of the invention, the method further comprising discretizing the NMR data and expressing the NMR data as M=KF+E, where matrices K contain entries corresponding to k, respectively, and F and E represent discretized versions of $f_r(x,y)$ and $E_r(\tau_1,\tau_2)$.

According to an aspect of the invention, the random-sampler is a Monte Carlo sampler.

According to an aspect of the invention, the method includes the extracted information about the system of nuclear spins includes one or more characteristics of a fluid in communication with a formation.

According to an aspect of the invention, the method includes the generated ensemble of spectra includes one or more spectra, such that the one or more characteristics of the fluid are calculated from at least one spectrum of the one or more spectra According to an aspect of the invention, the method includes the generated ensemble of spectra includes two or more spectra, such that the one or more characteristics of the fluid are calculated from each spectrum of the two or more spectra.

According to an aspect of the invention, the method includes analyzing the performed random-sampler inversion results comprises determining one of a porosity function, a bound fluid function or an unbound fluid function, associated with the NMR data.

According to an aspect of the invention, the method includes analyzing the performed random-sampler inversion results comprises determining one of an oil saturation function or a log-mean $T_2$ function, associated with the NMR data According to an aspect of the invention, the method includes the acquired NMR data is one of one dimensional (1D), two dimensional (2D) or multi-dimensional.

According to another embodiment of the invention, a system of interpreting and analyzing of Nuclear Magnetic Resonance (NMR) data to characterize properties of a fluid in communication with a subterranean environment (as used hereinafter, the term "rock" can include earth, earth formation, and a portion of earth formation), the system comprising: performing a plurality of NMR measurements on the fluid so as to obtain NMR data; acquiring NMR data from each of the plurality of NMR measurements; performing data inversion using a Monte Carlo sampler to generate an ensemble of spectra whereby characterized properties of the fluid are determined; and analyzing the performed Monte Carlo inversion results to characterize the properties of the fluid.

According to another embodiment of the invention, a method of extracting information about a fluid in a rock comprising: (a) applying a sequence of magnetic field pulses to the fluid, the sequence describe by at least two parameters, wherein each parameter includes two or more settings; (b) detecting magnetic resonance signals for each of the two or more settings for each parameter; (c) expressing the detected magnetic resonance signals as magnetic resonance signal data; (d) performing data inversion using a Monte Carlo sampler to generate an ensemble of spectra whereby characterized properties of the fluid are determined; (e) and analyzing the performed Monte Carlo inversion results to characterize the properties of the fluid in the rock.

According to an aspect of the invention, the method repeating steps (a) through (e) above incorporating at least one different setting from the two or more settings for at least one parameter of the at least two parameters.

According to an aspect of the invention, the method includes a first parameter of the at least two parameters comprises a longitudinal relaxation time associated with the fluid.

According to an aspect of the invention, the method includes the first parameter comprises a transverse relaxation time associated with the fluid.

According to an aspect of the invention, the method includes the first parameter comprises a diffusion sensitive parameter whereby diffusion is determinable.

According to an aspect of the invention, the method includes a second parameter of the at least two parameters comprises a longitudinal relaxation time associated with the fluid.

According to an aspect of the invention, the method includes the second parameter comprises a transverse relaxation time associated with the fluid.

According to an aspect of the invention, the method includes the second parameter comprises a diffusion sensitive parameter whereby diffusion is determinable.

According to an aspect of the invention, the method includes analyzing the performed Monte Carlo inversion results comprises determining one of a porosity function, a bound fluid function or a unbound fluid function, associated with the NMR data.

According to an aspect of the invention, the method includes analyzing the performed Monte Carlo inversion results comprises determining one of a oil saturation function or a log-mean $T_2$ function, associated with the NMR data.

According to an aspect of the invention, the method includes the acquired NMR data being one of one dimensional (1D), two dimensional (2D) or multi-dimensional.

According to another embodiment of the invention, a logging apparatus comprising: at least one tool that is moveable through a borehole; a processor coupled with the at least one tool, the processor being programmed with instructions which, when executed by the processor, cause the at least one tool to: perform a plurality of Nuclear Magnetic Resonance (NMR) measurements on at least one region of investigation within a formation surrounding the borehole; acquiring NMR data from each of the plurality of NMR measurements; and cause the processor to: perform data inversion using an Monte Carlo sampler to generate an ensemble of spectra so as to extract information about the at least one region of investigation within the formation surrounding the borehole; and analyze the performed Monte Carlo inversion results to extract information about the at least one region of investigation within the formation surrounding the borehole.

According to an aspect of the invention, the logging apparatus includes acquiring NMR data is in real time and the analysis process is continuous logging NMR data of the formation.

According to an aspect of the invention, the logging apparatus includes the results of the data inversion is communicated to a earth surface in one of real time or stored on the at least one tool for later communication.

According to an aspect of the invention, the logging apparatus includes the acquired NMR data is one of one dimensional (1D), two dimensional (2D) or multi-dimensional.

According to an aspect of the invention, the logging apparatus includes the Monte Carlo inversion analyzes one of an uncertainty of an inversion spectrum or other quantities derived from the inversion spectrum.

According to an aspect of the invention, the logging apparatus includes analyzing the performed Monte Carlo inversion results comprises determining one of a total porosity function or a fractional porosity function, associated with the NMR data.

Further features and advantages of the invention will become more readily apparent from the following detailed description when taken in conjunction with the accompanying drawings.

BRIEF DESCRIPTION OF DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein:

FIG. 1b shows an aspect of the invention, illustrating the large range of solutions which are indicated by the diversity of the compatible spectra;

DETAILED DESCRIPTION OF THE PREFERRED EMBODIMENTS

Figure 1A:
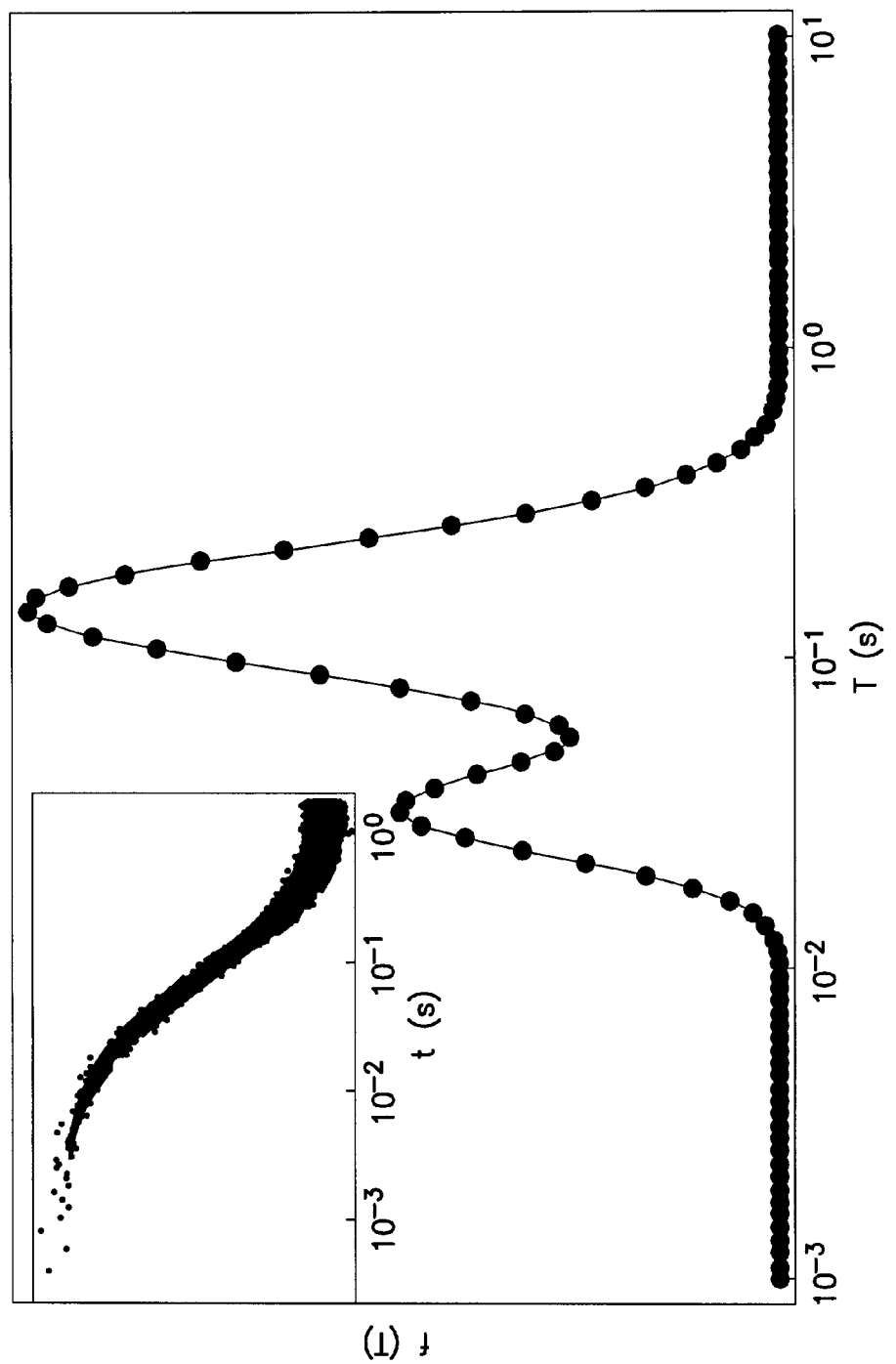
FIG. 1a illustrates the $T_2$ spectrum used to synthesize the $T_2$ echo data in the inset, in accordance with an embodiment of the invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice. Further, like reference numbers and designations in the various drawings indicated like elements.

According to an embodiment of the invention, a method of extracting information about a system of nuclear spins comprising: performing a plurality of Nuclear Magnetic Resonance (NMR) measurements on the system of nuclear spins; acquiring NMR data from each of the plurality of NMR measurements; performing data inversion using a random-sampler (or Monte Carlo sampler) to generate an ensemble of spectra so as to extract information about the system of nuclear spins; and analyzing the performed random-sampler inversion results to extract information about the system of nuclear spins.

OVERVIEW OF METHODS OF THE INVENTION

According to methods of the invention, the methods relate to the analysis and/or interpretation of NMR data obtained in wireline logging and logging while drilling. Further, the methods can be used in a laboratory to analyze NMR data obtained from core samples. Further, methods of the invention can be used in interpreting NMR logging data from wireline tools such as CMR and MR Scanner, and LWD tools (ProVision). It is also possible for the methods of the invention to be used at the surface with a well-site NMR analyzer to study the cuttings and fluids from the well. A portable NMR analyzer could also be used in conjunction with the PVT system to analyze live crude oils and/or gases. As noted above, NMR can be used in oilfield logging services to analyze rock properties (e.g. porosity, bound fluid, pore sizes, capillary curve, permeability) as well as the properties of the reservoir fluids (e.g. identifying oil/gas/water, oil viscosity, oil composition). These properties are obtained by evaluating some functionals of the spectra. For example, porosity can be obtained by integrating the entire spectrum; bound fluid can be obtained by integrating the $T_2$ spectrum below some cutoff $T_2$ value.

Methods of the invention, among other things, describe a new Laplace inversion algorithm that is conceptually different from all previous known methods. For example, the method uses a Monte Carlo method (sampler) (or a random-sampler) to generate a large ensemble of samples (e.g. $T_2$ spectra) that can all statistically fit the experimental data. For example, for a given $T_2$ decay data, 10,000 samples maybe generated by the Monte Carlo sampler. The entire ensemble of the spectral samples (or called spectra) can be considered as the solution of the Laplace inversion problem. The petrophysical properties can then be obtained from the ensemble by averaging the appropriate integrals of all spectra. In fact, at least one advantage of methods of the invention is that not only can the average properties be obtained, the error of the quantity can also be determined from the statistics of the results from all the spectra.

Further, methods of the invention can overcome such problems as the Rodriguez-Yam samplers noted above by improving convergence as well as speeding up the overall process, among other things. For example, the Rodriguez-Yam samplers (noted above) are truncated normal distributions of which non-negative normal samples are a subset. Since, the Rodriguez-Yam samplers are based on Gibbs' samplers that update the spectral estimate just one $T_2$ component at a time (e.g., when all of the spectral elements are fixed but one), that one has little room for change without violating the noise constraints on the data. This means that each spectral sample of Rodriguez-Yam samplers can only be slightly different from the preceding sample, indicating a high degree of statistical correlation and thus results in being an inappropriate solution due to the very slow convergence. The methods of the invention, among other things, resolves these issues by simultaneously updating two neighboring spectral components at a time, allowing changes due to one spectral component to be offset by changes in its neighbor. Thus, a fast 2D sampler for non-negative normal distributions can be created providing for improved convergence by more than two orders of magnitude over the known prior art methods. Also, another advantage of using the present methods of the invention over the known prior art is the capability for routine Monte Carlo inversion of 1D NMR spectra along with the inversion of 2D NMR spectra.

Finally, methods of the invention overcome the above-mentioned known methods in the art, by providing methods that (by non-limiting examples): 1) do not require artificial parameters; 2) provide for an efficient Monte Carlo algorithm that generates thousands of probable solutions; and 3) allow for individual solutions to be obtained from probability distributions for quantities derived from the spectrum that can include porosity and bound fluid, from which the statistical properties for a solution can be analyzed. Thus, among other things, it is the ability to characterize the uncertainty of such quantities which is unique and overcomes and above-mentioned known methods in the art.

METHODS OF THE INVENTION

FIG. 1a illustrates the behavior of two approaches used for simulated spin echo decay which will be later explained. The spectrum and its associated simulated noisy data are also shown in FIG. 1a. It is noted that in the study of heterogeneous-materials, both natural substances and manmade products, NMR spin relaxation spectra and diffusion constants are often used as a finger-print of the molecular species, structure and dynamics. For example, water and crude oils present in oil reservoirs can be distinguished by diffusion and relaxation experiments (see R. L. Kleinberg, Well logging, in: Encyclopedia of nuclear magnetic resonance, Vol. 8, Wiley, N.Y., 1996, pp. 4960-4969). Typically, spin relaxation and diffusion are manifested as de-carrying signals. As noted above, data analysis often involves Laplace inversion to obtain a spectrum of relaxation times or diffusion constants. Such an inversion is ill-conditioned in the sense that for a given set of data with finite noise, many solutions will fit the data within the statistics of the noise. The well-established methods, for example, Tikonov regularization (see A. N. Tikhonov, V. A. Arsenin, Solution of Ill-posed Problems, Winston and Sons, 1977), and the maximum entropy method (see J. Skilling, Classic maximum entropy, in: J. Skilling (Ed.), Maximum Entropy and Bayesian Methods, Cambridge, Kluwer, 1989, pp. 45-52; and S. F. Gull, Developments in maximum entropy data analysis, in: J. Skilling (Ed.), Maximum Entropy and Bayesian Methods, Kluwer Academic, Dordrecht, 1989, pp. 53-71), find one solution that fits the data and satisfies some other simultaneous constraint. This type of approach effectively makes a choice of the class of solution based on independent criteria. In the case of the regularization solution (as discussed above), smoother spectra are preferred over more spiky spectra. Different algorithms essentially use different preferences and thus result in different "best" solutions. However, it is difficult to justify these choices. In order to illustrate this, specific examples will be set-forth describing the multiplicity of the solutions.

NMR signals of $T_2$ decay in porous materials are well modeled as a sum of decaying exponentials:

$$m(t) = \int_0^\infty f(T) \exp(-t/T) d\log(T), f(T) \geq 0, \quad \text{Eq. 1}$$

where m(t) is the signal as a function of time and f(T) is the spectrum as a function of relaxation time T. In the following we use the discrete form of this formula, $$m = Gf, f \geq 0, \quad \text{Eq. 2}$$

with vector $m = \{m(t_i), i=1, \ldots, M\}$, vector $f = \{f(T_j), j=1, \ldots, N\}$, and matrix $G = \{G_{ij} = \exp(-t_i/T_j)\Delta\log(T_j)\}$. The principle commonly used in inversion is to use regression to find a solution $f_0$ that fits the data "best" by some criteria. One approach is to find the minimum misfit solution by least squares:

$$f_0 = \operatorname*{argmin}_{f_0 \geq 0} |m - Gf|^2, \quad \text{Eq. 3}$$

using the L2 norm. The solution to this problem is unique and can be efficiently found using the non-negative least squares algorithm (see C. L. Lawson, R. J. Hanson, Solving least squares problems, Prentice-Hall, Englewood Cliffs, N.J., 1974). These solutions tend to have only a small number of non-zero elements (see R. L. Parker, Y.-Q. Song, Assigning uncertainties in the inversion of NMR relaxation data, Journal of Magnetic Resonance 174 (2005) 314-324). The position of these "spikes" is sensitive to the noise, creating a spectral solution that is not repeatable over different noise realizations. Another often used approach regularizes the least-squares equations using $$f_0 = \operatorname*{argmin}_{f_0 \geq 0} (|m - Gf|^2 + \alpha|f|^2), \quad \text{Eq. 4}$$

where α is a scalar regularization parameter chosen to be just large enough to make the solution stable in the presence of noise.

Examples are given in FIG. 1b to illustrate the behavior of these two approaches using a simulated spin echo decay. The spectrum and its associated simulated noisy data are shown in FIG. 1a. Two least-squares $T_2$ spectra resulting from separate noise realizations with the same noise model are shown in FIG. 1b, demonstrating the sharpness of the peaks and the sensitivity to noise realization. The true spectrum is overlain as a dashed curve for comparison. The corresponding regularized spectra are also overlain, showing good consistency with respect to noise realization. Further, FIG. 1a shows the $T_2$ spectrum used to synthesize the $T_2$ echo data in the inset. The 100 $T_2$ spectral values are logarithmically spaced between 0.0001 and 10 seconds (s). The 8192 echoes are sampled at an echo spacing of 0.0002 s starting at 0.0002 s. The noise standard deviation is 0.025 of the maximum echo value. FIG. 1b compares the spiky spectrum evaluated by the maximum likelihood method (results scaled to approximately 10% to fit on the plot) with the smooth regularized $T_2$ spectral solution. The black dots are solutions for the data shown in FIG. 1a, and the gray dots are solutions for the same data but with a different noise realization. The original $T_2$ spectrum is overlain as a dashed curve for comparison. All the curves shown are presented at the same scale.

Still referring to FIGS. 1a and 1b. A shortcoming of both least squares and regularization approaches that is held in common with all "best fit" solution approaches is that they provide no indication of the uncertainty in the resulting $T_2$ spectrum, i.e., they ignore the range of other spectral solutions that are also compatible with the measurements. The large range of such solutions is clearly indicated by the diversity of compatible spectra shown in FIG. 1b.

The Monte Carlo method is used with the methods of the invention to probabilistically sample the range of solutions that are consistent with the data. Then the statistical properties of these spectral solutions are examined. After demonstrating that the $T_2$ spectral sampling problem is one of sampling from a truncated multi-normal distribution, where the truncation results from the non-negativity constraint, it can be shown that the nature of the truncated multi-normal distribution precludes the use of efficient truncated normal samplers already in the literature. It is then possible to present a new a sampling algorithm that allows rapid sampling of $T_2$ spectral solutions. This algorithm can be used to analyze the uncertainty of the inversion spectrum and other quantities derived from the spectrum. Compared to known prior art methods relating to work on the uncertainty bounds of the $T_2$ spectrum (see R. L. Parker, Y.-Q. Song, Assigning uncertainties in the inversion of NMR relaxation data, Journal of Magnetic Resonance 174 (2005) 314-324), the methods of the invention can, among other things, provide for an estimate of the full probability density functions of the functionals of interest. The details of the truncated normal samplers are further discussed in the Truncated Multi-normal Samplers section below.

The inverse problem of determining f from a noisy measurement of m is one of finding the values of f for which the residuals $\epsilon = m - Gf$ are compatible with the measurement noise, i.e., the covariance of $\epsilon$ should be consistent with the measured noise covariance. It is important to emphasize that an infinite number of solutions exist which satisfy this criterion. The noise in $T_2$ signals is often of the simple form of an uncorrelated normal distribution (see R. L. Parker, Y.-Q. Song, Assigning uncertainties in the inversion of NMR relaxation data, Journal of Magnetic Resonance 174 (2005) 314-324). Thus the probability density function (pdf) of f, $\pi(f)$, can be expressed succinctly as $$\pi(f) \propto \exp\left[-\frac{1}{2}(m-Gf)^T \Lambda^{-1}(m-Gf)\right], f \geq 0, \quad \text{Eq. 5}$$

where $\Lambda$ is a diagonal matrix containing the noise variance versus time. Since the noise variance is often well approximated as constant in time for a single measurement, in the following we simplify Eq. 5 with the approximation $\Lambda = \sigma^2 I$, where $\sigma^2$ is the measured noise variance and I is the identity matrix.

In the parlance of Bayesian inference, Eq. 5 is called the likelihood function. It gives the probability of the measurement, m, conditioned on a given model, f. This is usually written as $\pi(m|f)$. In Bayesian inference one would sample from the posterior, $\pi(f|m)$, which is related to $\pi(m|f)$ through Bayes' rule: $\pi(f|m) \propto \pi(m|f)\pi(f)$, where $\pi(f)$ is the prior. Here we choose the prior to be constant, meaning that we are sampling directly from the likelihood. An excellent tutorial on Bayesian methods is given in the Sivia reference (see D. S. Sivia, J. Skilling, Data Analysis: A Bayesian Tutorial, 2nd Edition, Oxford University Press, New York, 2006).

One of the simplest methods for finding random samples drawn from Eq. 5 is to use standard methods to first draw a large number of samples from the multi-normal distribution (without the non-negativity constraint), and then accept only samples which satisfy $f \geq 0$. However, this method is astronomically inefficient for the $T_2$ spectral inversion problem since the fraction of multi-normal samples that satisfy $f \geq 0$ is miniscule. It is important to account for the structure of the multi-normal covariance matrix in order to achieve efficient sampling.

Two Monte Carlo samplers in the literature for efficiently solving the more general problem of sampling from a truncated multi-normal distribution in high dimensions are (E. Kermidas, S. Kaufman (Eds.), Efficient simulation from the multivariate normal and Student-t distributions subject to linear constraints, Computing Science and Statistics: Proceedings of the 23rd Symposium in the Interface, Interface Foundation of North America, Fairfax, Va., 1991) and (G. Rodriguez-Yam, R. Davis, L. Scharf, Efficient Gibbs sampling of truncated multivariate normal with application to constrained linear regression, Tech. rep., Colorado State University 2004). In the methods of the invention, truncation reflects the non-negativity constraint in the $T_2$ inversion. These two methods (TN1 and TN2) are Gibbs samplers (see C. P. Robert, G. Casella, Monte Carlo Statistical Methods, Springer, N.Y., 2004), for example, they sample an N-dimensional pdf as a sequence of one-dimensional sampling problems. Gibbs' samplers are particularly effective for truncated multi-normal distribution because efficient algorithms are available for each one-dimensional sampling problem. Unfortunately, both methods perform poorly with the truncated multi-normal distribution found in $T_2$ inversion. Further details of the truncated normal samplers are discussed in the Truncated Multi-normal Samplers section below.

In addressing the enhanced Gibbs' sampler, called TN3, the methods of the invention overcome the limitations of the two Gibbs samplers mentioned above by making a modest extension of the Gibbs' sampling approach. As discussed in more detail in the Truncated Multi-normal Samplers section below, TN1 is limited because it is unable to traverse in big steps along the major axes of the covariance ellipsoid, and TN2 is limited by the non-negativity constraint which causes it to become "stuck in the corner." We found that the simultaneous sampling of two parameters ($T_i$ and $T_{i+1}$) in a two-dimensional sampler can solve both problems. For further details of the truncated normal samplers see the Truncated Multi-normal Samplers section below.

For the NMR $T_2$ spectral inversion problem methods of the invention have found it most effective to use adjacent spectral dimensions in the two-dimensional Gibbs' update steps. Only one iteration of the slice sampler is used for each sample update because it was found that using more did not improve convergence. This is called algorithm TN3. Further considerations for efficient implementation are presented in the Two-dimensional Slice Sampler section below.

Algorithm TN3 was run on the $T_2$ data shown in FIG. 1a. The run time to generate 10000 samples on a 3.2 GHz linux desktop machine was approximately 4 seconds. The degree of mixing (statistical independence between samples) is investigated, as it was for samplers TN1 and TN2 (as discussed in the Truncated Multi-normal Samplers section below), by examining the correlation between samples for dimension 61 a dimension of large correlation for TN1 and TN2. Comparing this correlation plot, given in FIG. 2, with those for TN1 and TN2 for the same data (as further discussed in the Truncated Multi-normal Samplers section below), shows that the TN3 samples are only weakly correlated after about ten samples instead of the thousands of samples needed for de-correlation with TN1 and TN2.

Figure 3:
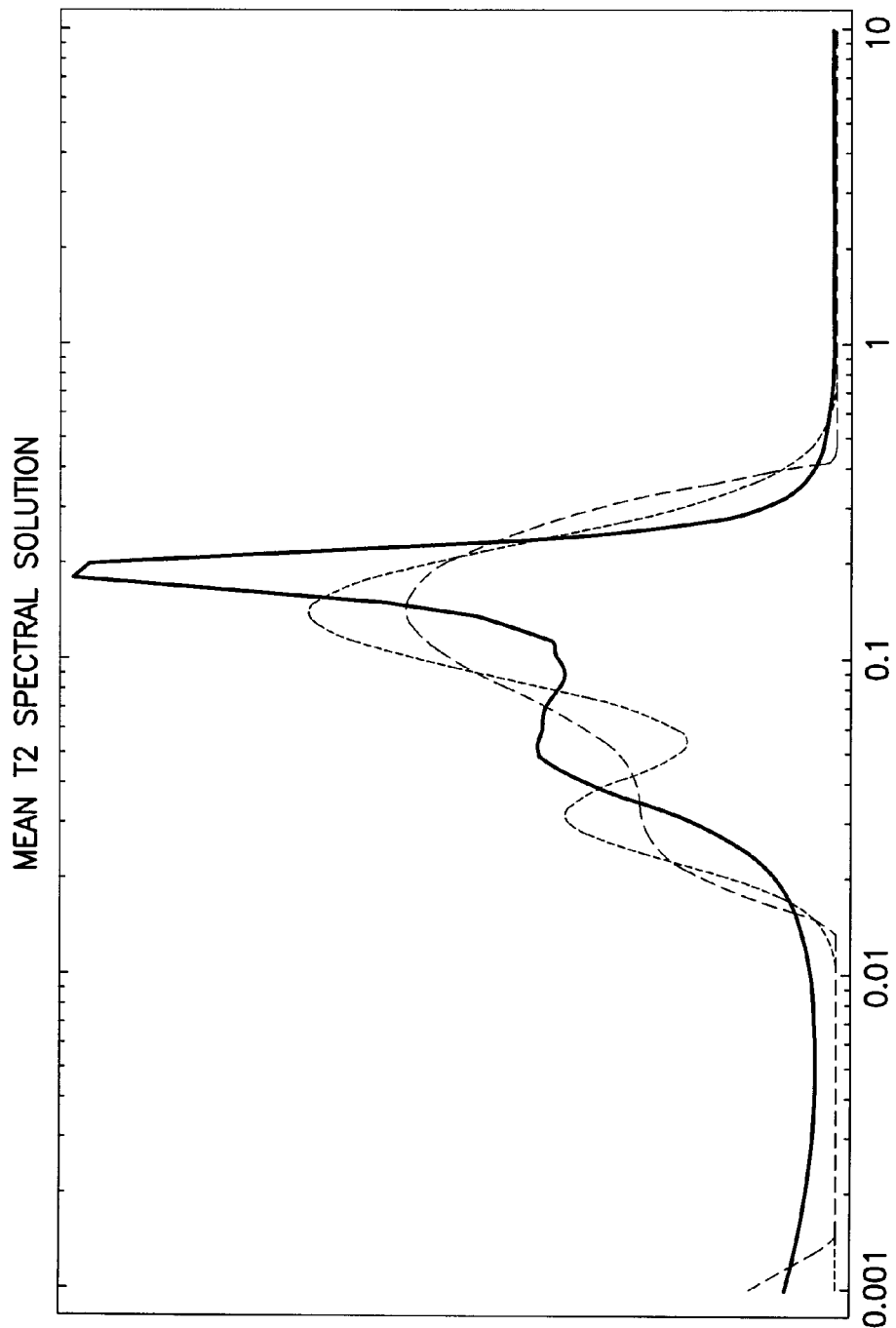
FIG. 3 shows an aspect of the invention, illustrating the mean $T_2$ spectrum computed from 10,000 samples (using TN3) for the data in FIG. 1.

FIG. 3 illustrates the mean $T_2$ spectrum computed from 10000 samples using TN3 for the data in FIG. 1a which is displayed as a solid black line curve. For comparison, the original $T_2$ spectrum is overlain in short dashes and the regularized spectral solution as long dashes. The dotted curve shows the mean spectrum for data containing only noise (no signal) with the same noise statistics as the other curves. Although the position and width of the mean spectral peak agrees well with the original spectrum, the spectral values corresponding to small $T_2$ are upwardly biased. This upward bias increases with diminishing T and is produced by two factors. First, Eq. 1 indicates that only data with small t are used to determine f(T) for small values of T. Having fewer data constraints at small T results in greater uncertainty. Second, the non-negativity constraint forces this uncertainty to be expressed as positive spectral values. In the limit, for values of T much smaller than the smallest t sample in the data, the spectral value is allowed to be any positive number. The dotted curve in FIG. 3 highlights this bias by showing the mean spectrum corresponding to only the noise component of the spectrum (no signal), clearly showing the increasing bias at small values of T. This bias must be considered when using spectral samples of the likelihood function for uncertainty quantification. The best means for addressing this bias is to replace the constant prior in our formulation with a more appropriate one.

Figure 2:
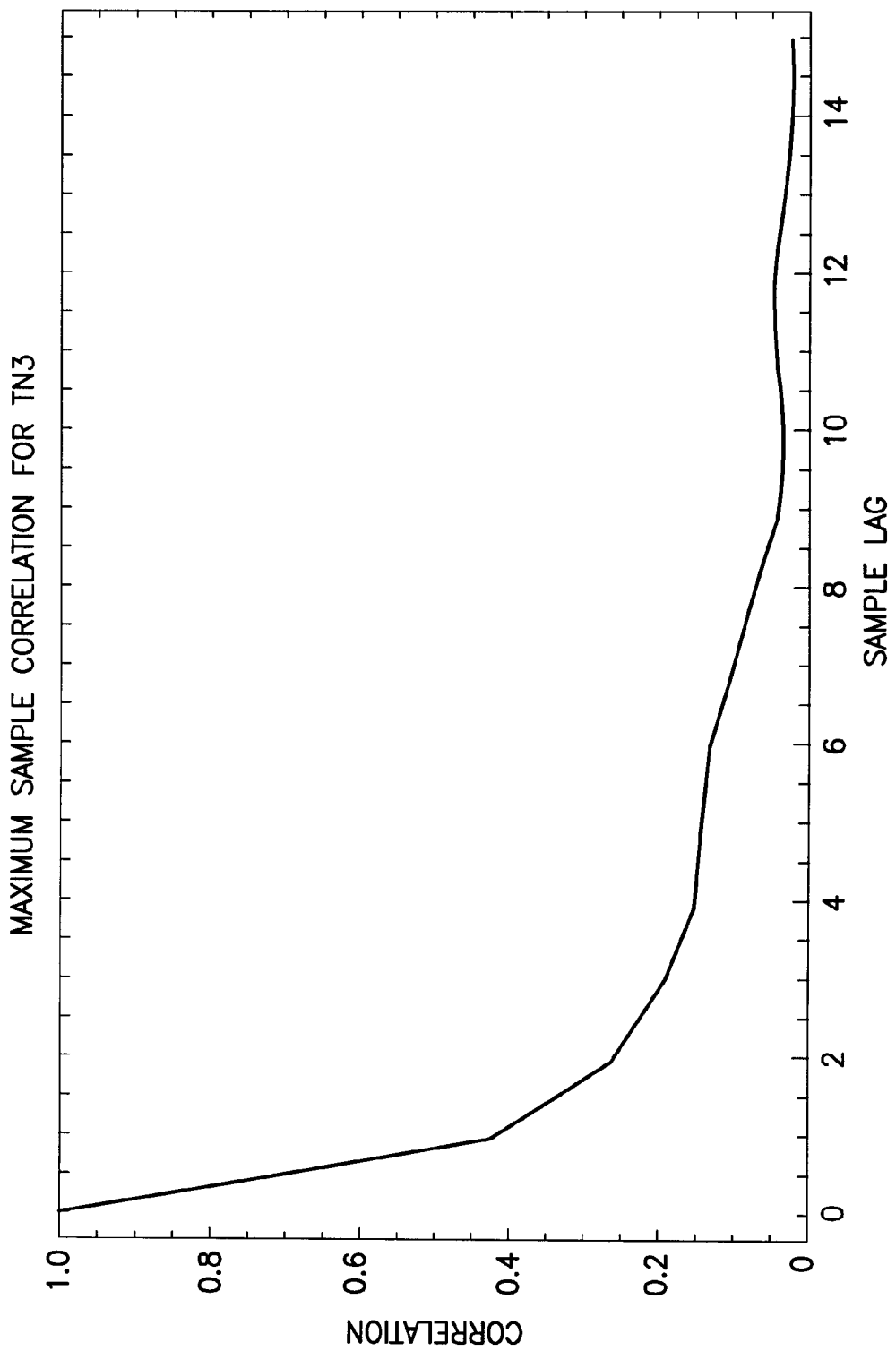
FIG. 2 illustrates an aspect of the invention, showing sampler TN3 applied to the $T_2$ echo data shown in FIG. 1, generating 10,000 samples.

Still referring to FIGS. 2 and 3, despite the similarity of the mean spectrum and the regularized spectrum, we must resist the temptation to use the mean spectrum as the inversion result. The inversion result is in fact the entire ensemble of the solutions (e.g., 10000 spectra) obtained by the Monte Carlo sampler. Although the mean spectrum is a solution, it is just one aspect of the solution. The solution ensemble describes the broad range of solution possibilities, i.e., the uncertainty of the solution.

FIGS. 2 and 3 further address an application to functionals of $T_2$ spectra, wherein the multiplicity of spectral solutions becomes useful when they are summarized in terms of statistics. For example, the mean solution shown in FIG. 3 describes the tendency for these solutions to have a single spectral peak. Another useful class of statistical summaries is in terms of functionals of the $T_2$ spectrum, e.g., total porosity and fractional porosity. Here we demonstrate this approach by estimating the uncertainty in some functionals of the $T_2$ spectrum by Monte Carlo sampling using algorithm TN3.

Figure 4:
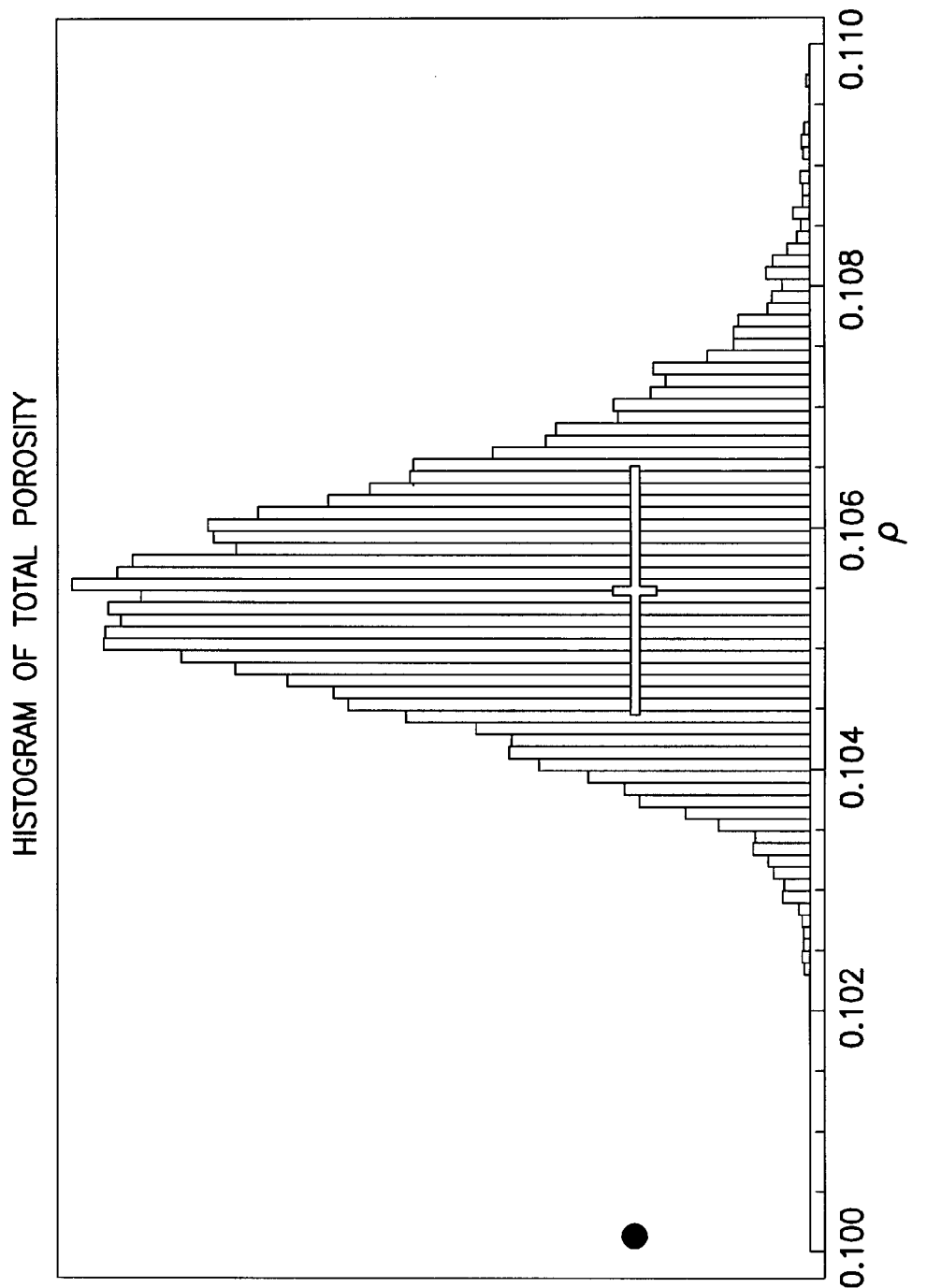
FIG. 4 illustrates an aspect of the invention, showing a histogram of total porosity, ρ, computed from 10,000 samples (using TN3) for the data I FIG. 1.
Figure 5:
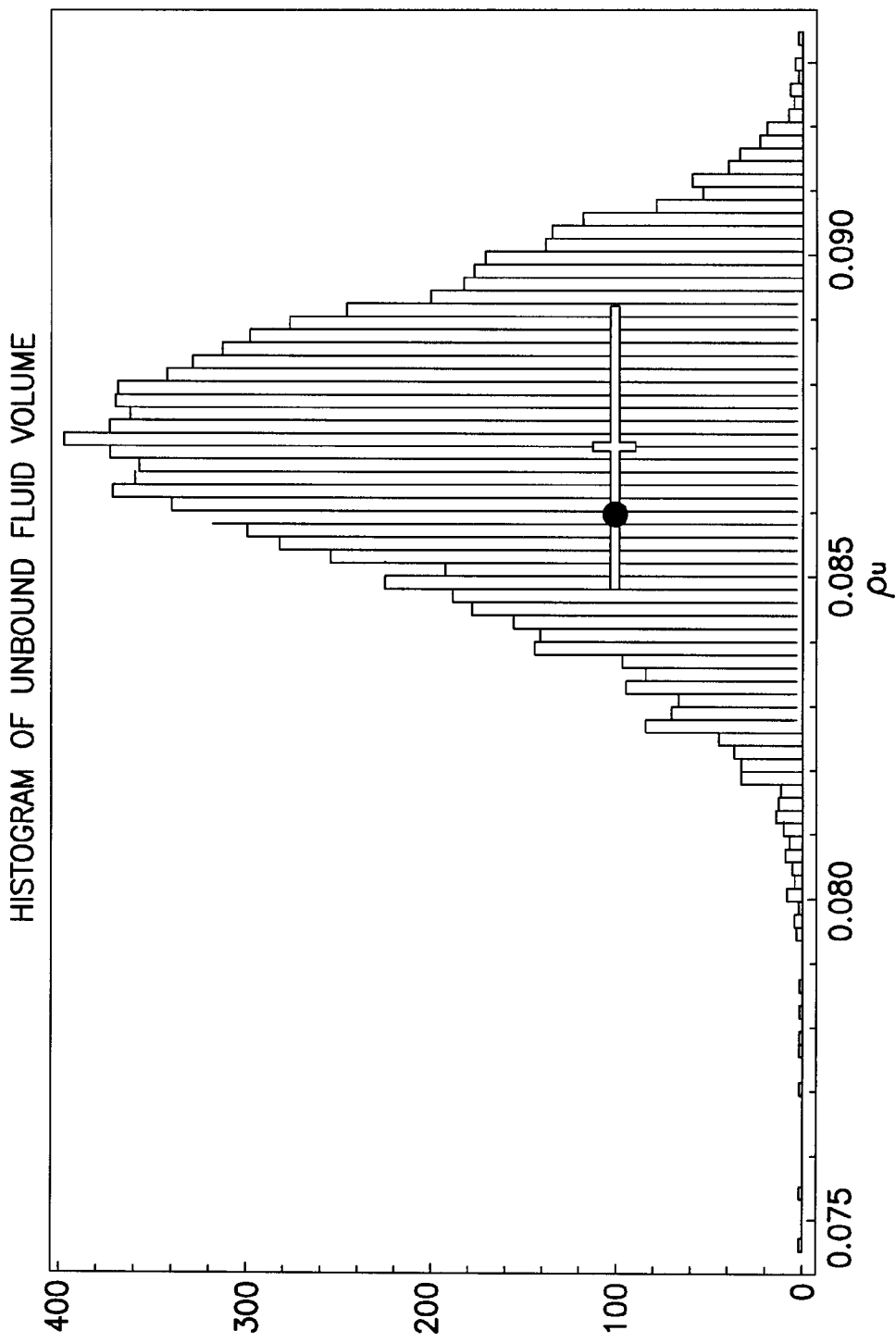
FIG. 5 shows an aspect of the invention, illustrating a histogram of unbound fluid volume ρU, computed from 10,000 samples (using TN3) for the data I FIG. 1.

Referring to FIGS. 4 and 5. FIG. 4 illustrates a histogram of total porosity, ρ, computed from 10,000 samples (using TN3) for the data in FIG. 1a. The total porosity, ρ, can be obtained by summing over the $T_2$ spectrum. Computing $1^T f$ for each of the Monte Carlo samples for the data in FIG. 1a, the uncertaint$_y$, in ρ is displayed in FIG. 4, yielding the estimate ρ≈0.1055±0.000996. Estimates from the regularized $T_2$ spectra in FIG. 1 are 0.1017 and 0.1008, and from the least-squares spectra are 0.1025 and 0.1011. Since this is a synthetic example, we can compute the true value: ρ=0.100. Our estimate of ρ is positively biased, being more than six standard deviations too high. As discussed in the previous section, this bias is due to the positive spectral bias for small values of T. The magnitude of this bias, found by computing spectral samples for data containing only noise (as was done for the dotted curve in FIG. 3) and then computing total porosity, was found to be 0.00557±0.000799. Subtracting this from the biased estimate yields the reasonable value ρ≈0.0999±0.0013.

It is known that NMR $T_2$ spectra are sensitive to pore sizes in rocks and other porous media. As a result, $T_2$ spectra have been used to obtain capillary curves (see R. L. Kleinberg, Well logging, in: Encyclopedia of nuclear magnetic resonance, Vol. 8, Wiley, N.Y., 1996, pp. 4960-4969). In particular, it was found that short $T_2$ corresponds to small pores where water will be held by capillary force. Only water in larger pores (i.e., large $T_2$) will participate in flow. The fraction of water in large pores (unbound fluid) is important in determining the permeability of a rock from an NMR measurement. The unbound fluid volume is defined as the integrated volume with $T_2$ larger than $T_c$:

$$\rho_U = \int_{\log T_c}^{\infty} f(T) d \log T, \quad \text{Eq. 6}$$

where $T_c$=0.033 s is a typical cutoff value for sandstones (see R. L. Kleinberg, Well logging, in: Encyclopedia of nuclear magnetic resonance, Vol. 8, Wiley, N.Y., 1996, pp. 4960-4969). The histogram of $\rho_U$ is shown in FIG. 5, yielding the estimate $\rho_U$≈0.0870±0.0021. Note that the true value, 0.0859, is comfortably within the standard error. Estimates from the regularized $T_2$ spectra in FIG. 1b are 0.0847 and 0.0834, and from the least-squares spectra are 0.0725 and 0.0688.

Thus, although the regularized approach to NMR $T_2$ spectral inversion yields a solution that is stable in the presence of noise, it fails to capture the considerable uncertainty present in the spectral inversion problem. It can be demonstrated that the spectral inversion problem can be expressed as Monte Carlo sampling problem with a non-negative multi-normal distribution when the Bayesian prior is a constant. Although this distribution is a special case of a truncated multi-normal distribution for which samplers exist in the literature, it is shown that these one-dimensional Gibbs' samplers are ineffective for the $T_2$ spectral inversion problem. According to methods of the invention, provided is a modest extension of these samplers in which the Gibbs sampling is done in two dimensions instead of one, and further demonstrate that it is an efficient sampler for the $T_2$ spectral inversion problem.

Using our new sampler, according to at least one method of the invention, it can be shown that sampling from the likelihood function (i.e., using a constant Bayesian prior) results in a positive bias in the $T_2$ spectrum that increases with decreasing T. The source of this bias is the non-negativity constraint combined with the diminishing number of data points which constrain the spectral solution with decreasing T. This bias results in the overestimation of mean total porosity and the underestimation of its uncertainty. However, since this bias becomes small with increasing T, it is possible to achieve a good estimate of unbound porosity, a quantity which does not depend on the spectrum at small values of T.

Truncated Multi-normal Samplers

Known methods using Monte Carlo samplers for the non-negative normal distribution are inefficient for $T_2$ spectral inversion. For example, samplers in the literature solve the more general problem of sampling from a truncated normal distribution (see G. Rodriguez-Yam, R. Davis, L. Scharf, Efficient Gibbs' sampling of truncated multivariate normal with application to constrained linear regression, Tech. rep., Colorado State University (2004)), which are defined by $$\pi(f) \propto \exp\left[-\frac{1}{2}(f-\mu)^T \Sigma^{-1}(f-\mu)\right], Af \leq b, \quad \text{Eq. 7}$$

where μ is the mean vector, $\Sigma^{-1}$ is the inverse covariance matrix, and A and b provide the linear truncation constraints. A is a potentially non-square matrix. In our case, b=0 and A=−I. The approaches of the Kermidas reference (TN1 approach) and Rodriguez-Yam reference (TN2 approach) are compared in Rodriguez-Yam reference (see E. Kermidas, S. Kaufman (Eds.), Efficient simulation from the multivariate normal and Student-t distributions subject to linear constraints, Computing Science and Statistics: Proceedings of the 23rd Symposium in the Interface, Interface Foundation of North America, Fairfax, Va., 1991; and G. Rodriguez-Yam, R. Davis, L. Scharf, Efficient Gibbs sampling of truncated multivariate normal with application to constrained linear regression, Tech. rep., Colorado State University (2004)). A brief outline of these two approaches is given below for the special case of a non-negative normal distribution in order to understand why these approaches are inefficient for $T_2$ spectral inversion. A third approach by the Philippe reference, which is based on perfect sampling by Robert reference, is not suited to high-dimensional problems and is thus most likely inappropriate for use with the methods of the invention (see A. Philippe, C. P. Robert, Perfect simulation of positive Gaussian distributions, Statistics and Computing 13 (2) (2003) 179-186; and C. P. Robert, G. Casella, Monte Carlo Statistical Methods, Springer, N.Y., 2004).

Both TN1 and TN2 are Gibbs' samplers by the Robert reference (see C. P. Robert, G. Casella, Monte Carlo Statistical Methods, Springer, N.Y., 2004). A Gibbs sampler samples an N-dimensional pdf as a sequence of one-dimensional sampling problems in which the sample for a particular dimension, say j, is drawn from the conditional pdf $\pi(f_j|f_{-j})$, where $f_{-j}$ represents the vector f with the j-th element removed. Each dimension is sampled, with each new sample replacing its old counterpart in f. After a pass through all dimensions of f, one sample of f is generated, and this serves as the starting point for the next sample. This approach is particularly effective for a truncated multivariate normal distribution because each one-dimensional sample is drawn from a truncated univariate normal distribution for which efficient samplers are available (see E. Kermidas, S. Kaufman (Eds.), Efficient simulation from the multivariate normal and Student-t distributions subject to linear constraints, Computing Science and Statistics: Proceedings of the 23rd Symposium in the Interface, Interface Foundation of North America, Fairfax, Va., 1991).

Figure 6A:
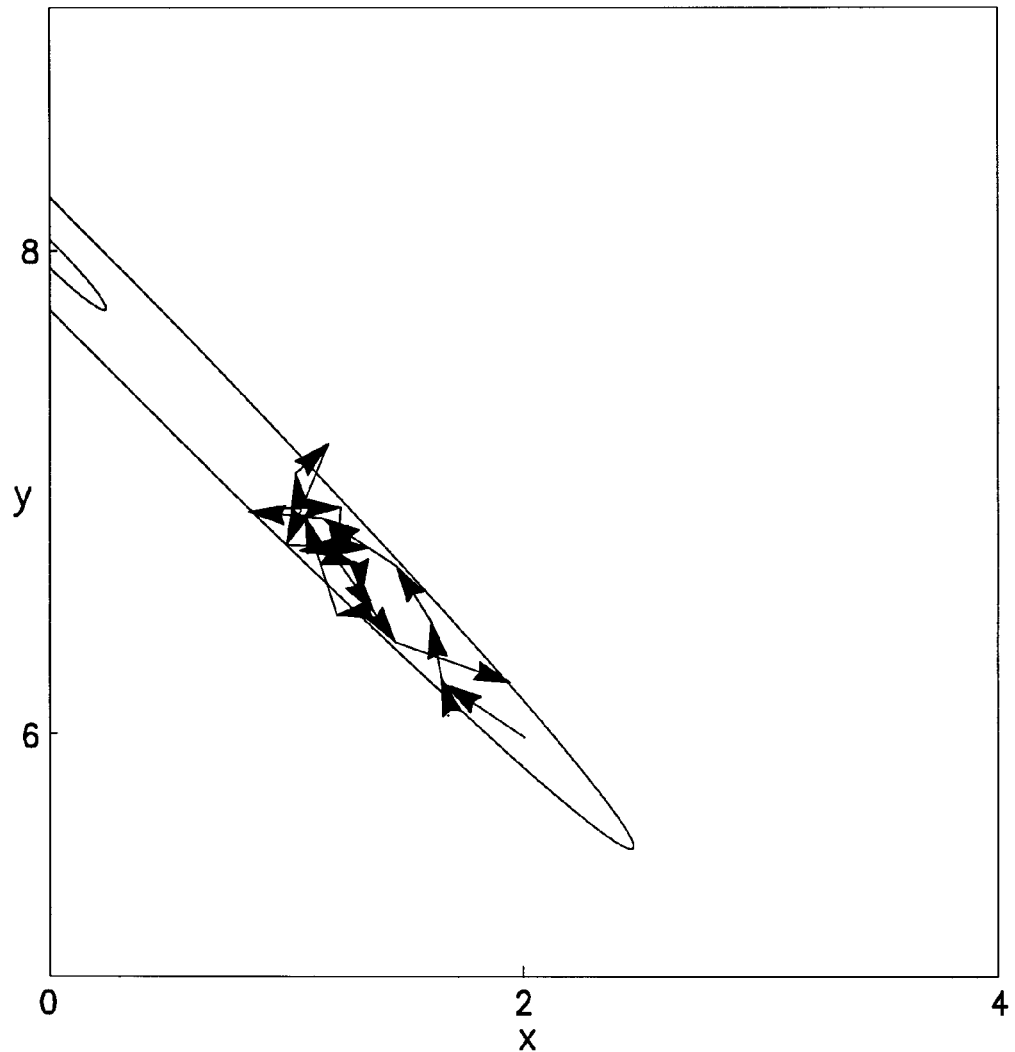
FIG. 6a illustrates a differences between Gibbs' samplers TN1 and TN2 for a two-dimensional sample problem.
Figure 7:
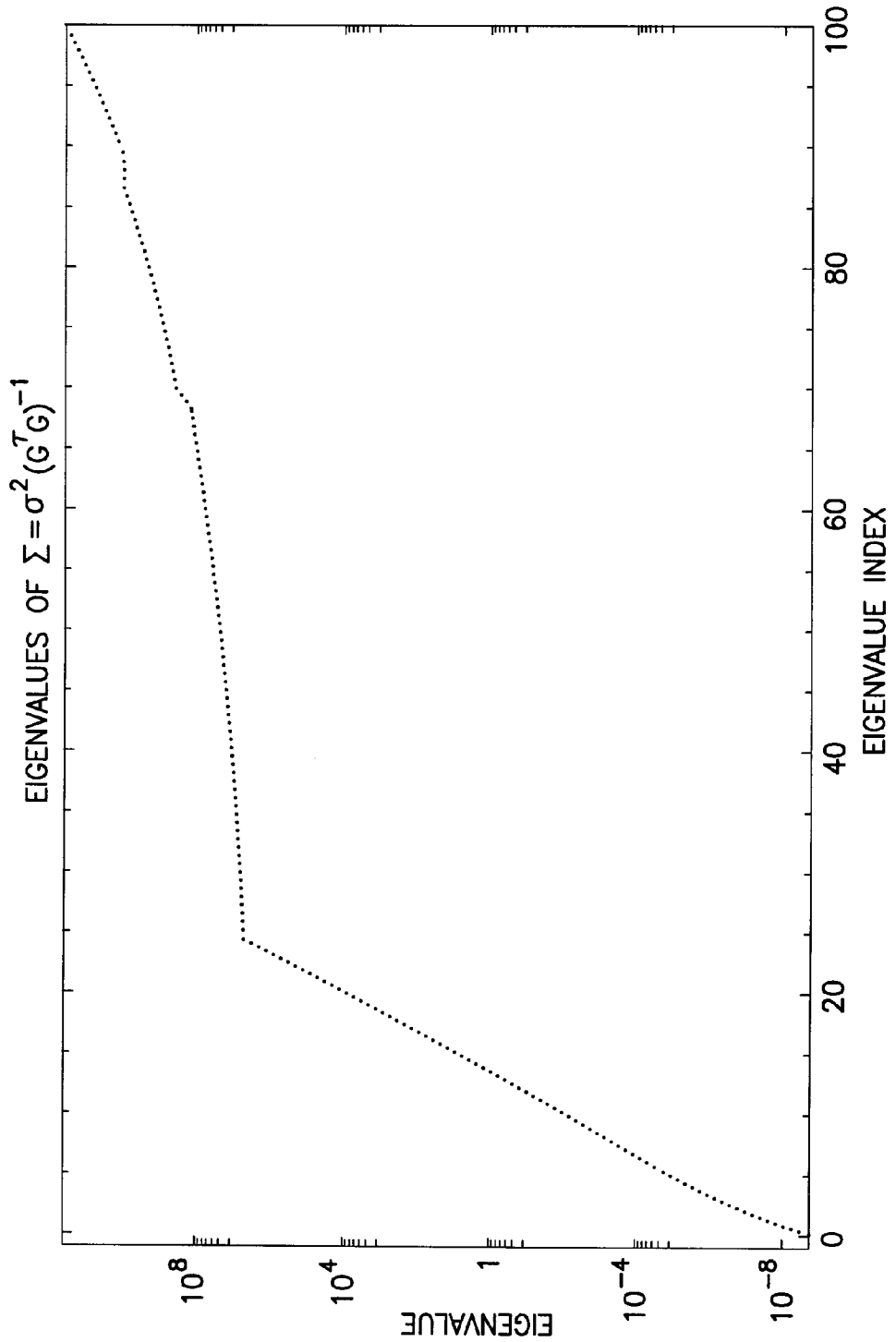
FIG. 7 illustrates eigenvalues of $\Sigma = \sigma^2 (G^T G)^{-1}$ plotted for FIG. 1 to indicate uncertainty can be effectively infinite along most principle axes of covariance ellipsoid and small along most of the remaining axial directions, indicating a high degree of correlation.

In order to understand the difference between TN1 and TN2, consider a two-dimensional example problem with a high correlation between coordinates x and y. The TN1 sampler samples alternately in the x and y dimensions. The large correlation leads to slow convergence. This example is shown in FIG. 6a, where the first 20 samples steps, starting from the point (2, 6), are indicated by arrows. The samples remain clustered near the starting point because each one-dimensional update step has its variance limited to the narrow conditional variance in the x or y directions. This leads to a strong correlation between consecutive samples, a problem that is exacerbated with increasing correlation in Σ. The importance of having a sampler that is robust in the presence of strong correlation is illustrated in FIG. 7. Here the eigenvalues of the example of FIG. 1a are seen to grow by a factor of $10^6$ over just the first 10 eigenvalues. Since these are the lengths of the principal axes of the covariance ellipsoid, it is clear that the uncertainty along most of these axes is effectively infinite, while the uncertainty along a few of these axes is tiny. This indicates a high degree of correlation.

Figure 6B:
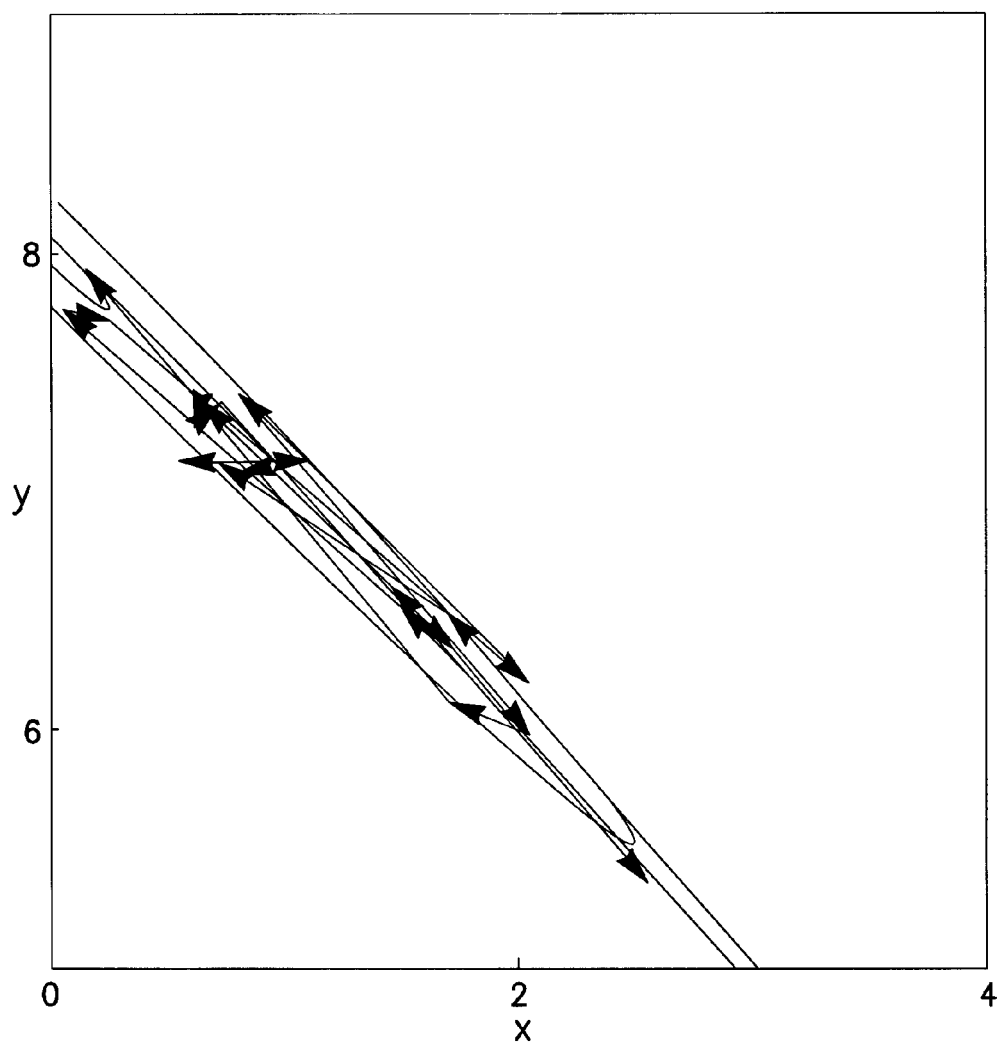
FIG. 6b shows the first 20 steps of the TN2 sampler starting at the point (2, 6), indicating an improved mixing.

TN2 improves on the efficiency of the TN1 sampler by sampling along the directions of the principle axes of the covariance ellipse (the eigenvector directions) instead of along the coordinate directions. This allows large steps to be taken along directions where the uncertainty is large. FIG. 6b shows the first 20 samples from the TN2 sampler for our two-dimensional problem. Note that TN2 has much better mixing than TN1, indicating much faster convergence.

Figure 8:
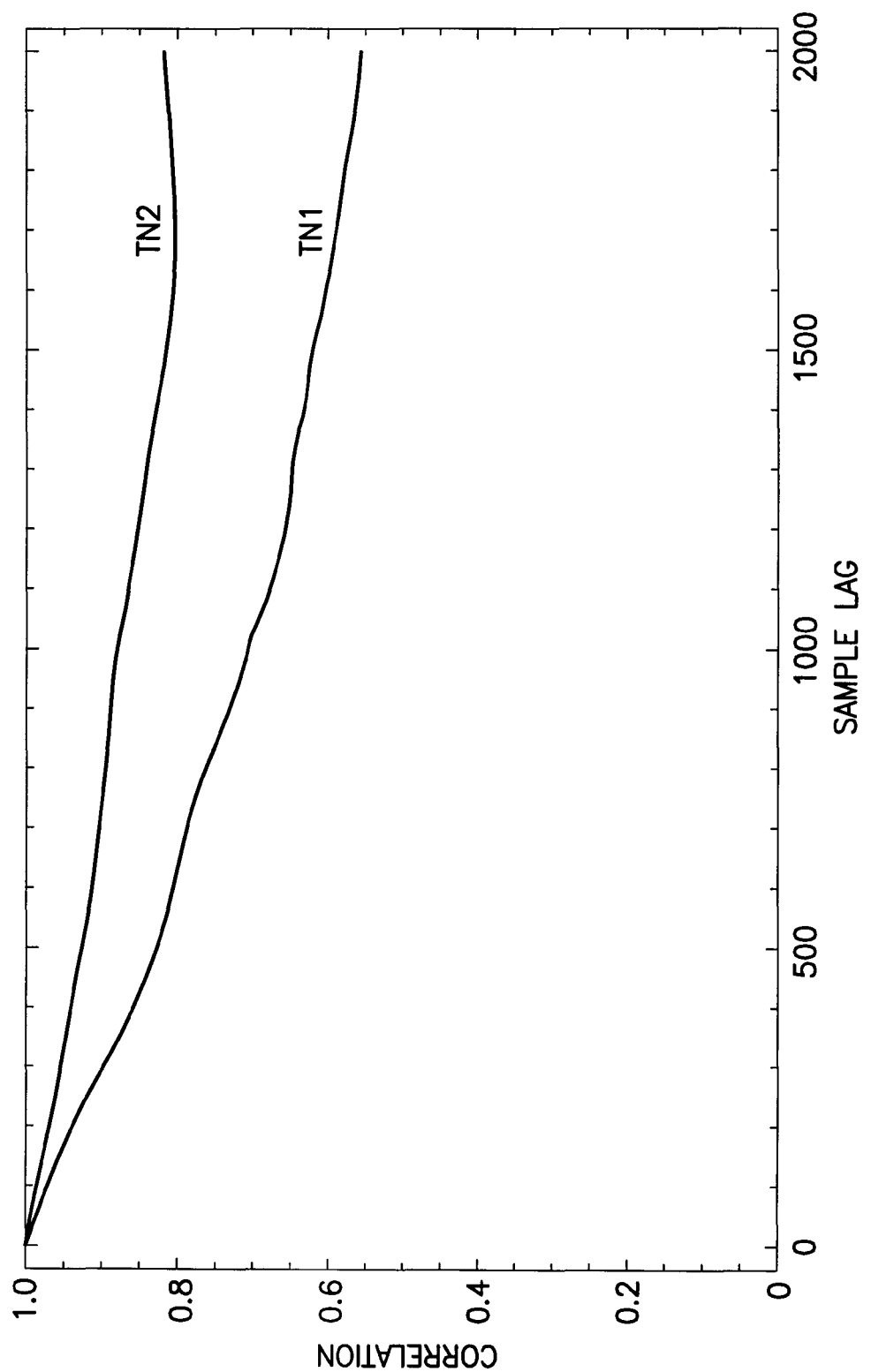
FIG. 8 illustrates a samplers TN1 and TN2 applied to the $T_2$ echo data of FIG. 1 generating 10,000 samples each, showing correlation between samples for TN1 and TN2, respectively, for spectral dimension 61 (T=0.266s)

The degree of mixing is indicated by the correlation between samples for each dimension. We analyze this for the noisy T2 echo data shown in FIG. 1. Because, each dimension has its own correlation plot, it is decided to plot the correlation for the dimension of maximum observed correlation, dimension 61 (T=0.266 s), which nearly coincides with the peak of the true T2 spectrum. This correlation is compared for samples from TN1 and TN2 in FIG. 8, indicating that both samplers require thousands of samples between each independent sample. This is a clear illustration of the inefficiency of these algorithms for T2 spectral inversion.

Figure 9A:
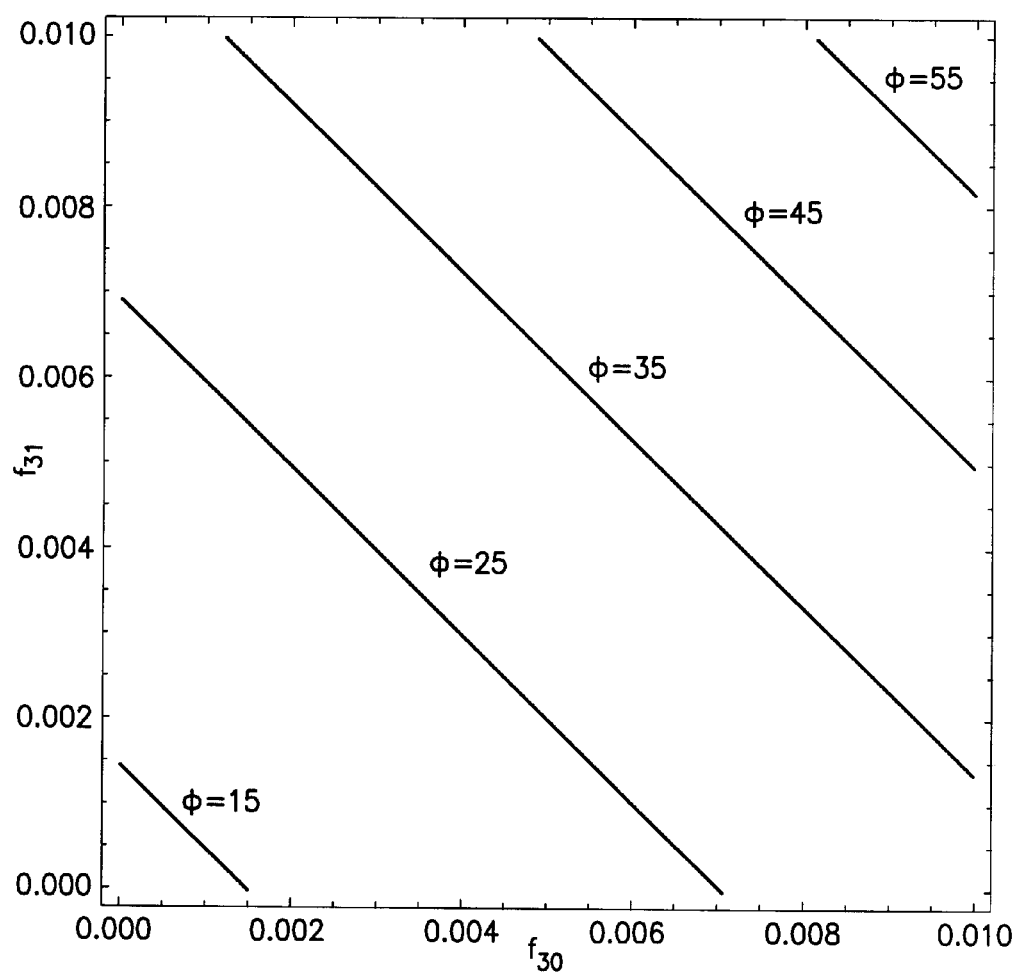
FIGS. 9a and 9b show the conditional pdfs for $T_2$ spectral dimensions (30,31) and (61,62), respectively, conditioned to the least-squares spectral solution for the $T_2$ echo data shown in FIG. 1.
Figure 9B:
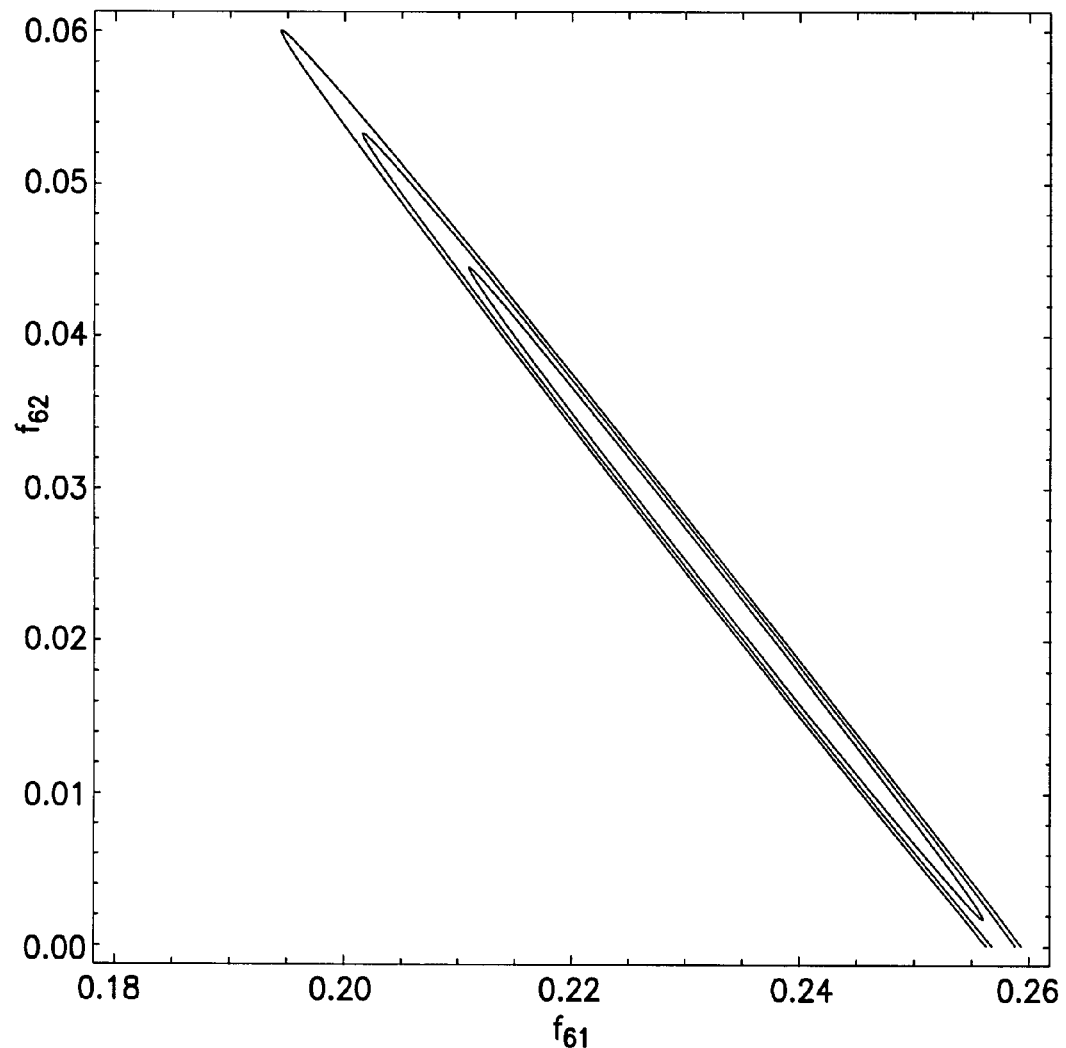

The reason for this poor convergence can be understood in terms of the structure of the multi-normal distribution in the T2 spectral inversion problem. This structure is illustrated by two-dimensional conditional covariance plots in FIGS. 9a and 9b. Starting with f defined by Eq. 3 for the data shown in FIG. 1a, we examined all consecutive pairs of conditional pdfs and found 86 of the form shown in FIG. 9a and 13 of the form shown in FIG. 9b, with the latter more likely near the peak of the spectrum. We demonstrated earlier (see FIG. 8) that TN2 has much better mixing than TN1 for latter form of covariance because the sample steps can jump long distances along the major axes of the covariance ellipse. However, this strategy fails for the covariance structure in FIG. 9a. For example, when the current state is at the origin in FIG. 9a, it is clear that no jump will be allowed along the major axis of the ellipse (along the contour direction) because that direction is blocked by the non-negativity constraint, and jumps along the minor axis (perpendicular to the contour direction) will feel a strong pull toward the origin, perpetuating the problem. Hence neither TN1 nor TN2 will converge well when both types of covariance are present.

Two-dimensional Slice Sampler

An excellent description of the slice sampler is given in the Robert reference (see C. P. Robert, G. Casella, Monte Carlo Statistical Methods, Springer, N.Y., 2004). A summary of the algorithm is provided below. For a pdf given by π(x) and a beginning state $x_0$, a uniform random sample, u, is drawn from the interval $0 \le u \le \pi(x_0)$. Then a uniform random sample of x is drawn from the domain defined by π(x)≥u. This new state, labeled $x_1$, is an estimate of the random sample satisfying π(x). Iterating this procedure leads to an independent sample from π(x).

For the truncated normal distribution we can simplify the slice sampler algorithm by defining $\pi(x_0) \propto e^{\Phi(x_0)}$ with $\Phi(x)=(x-u)^T H(x-\mu)$ and $H=\Sigma^{-1}=\sigma^{-2}G^T G$. Then a uniform sample of u is drawn from the interval 0<u<1, and $\Phi(x_1)=\Phi(x_0)-2\log u$. A uniform sample of x is then drawn from the do-main $\Phi(x) \le \Phi(x_1)$ with x≥0. We use rejection sampling to obtain a uniform sample from this truncated elliptical domain using the algorithm presented in Truncated Multi-normal Samplers section above noted in the Philippe reference (see A. Philippe, C. P. Robert, Perfect simulation of positive Gaussian distributions, Statistics and Computing 13 (2) (2003) 179-186).

The two-dimensional conditional values of μ and H for dimensions i and j, denoted $\hat{u}_m$ and $\hat{H}_m$, are given by $$\hat{u}_m = \mu_m + \Sigma_{-m}^T (\Sigma_{-mm})^{-1}(f_{-m} - \mu_{-m}) \text{ and } \hat{H}_m H_{mm}. \quad \text{Eq. 8}$$

The symbol m represents the pair of indices i and j. The subscript m on a vector or matrix indicates the selection of those elements. The subscript -m on a vector indicates the selection of all elements except those of m, and on a matrix it indicates the selection of the columns m minus the rows m. The subscript -mm indicates the selection of all rows and columns except those of m.

To find an expression for am that avoids computing the inverse of the poorly conditioned $G^T G$ matrix, we use the inverse formula for a partitioned matrix to get $$(\Sigma_{-mm})^{-1} = H_{-mm} - H_{-m} H_{mm}^{-1} H_{-m}^T$$

$$\Sigma_{-m} = -\Sigma_{-mm} H_{-m} (H_{-mm})^{-1}. \quad \text{Eq. 9}$$

yielding $$\hat{u}_m = \mu_m - (H_{mm})^{-1} H_{-m}^T (x_{-m} - \mu_{-m}). \quad \text{Eq. 10}$$

Figure 10:
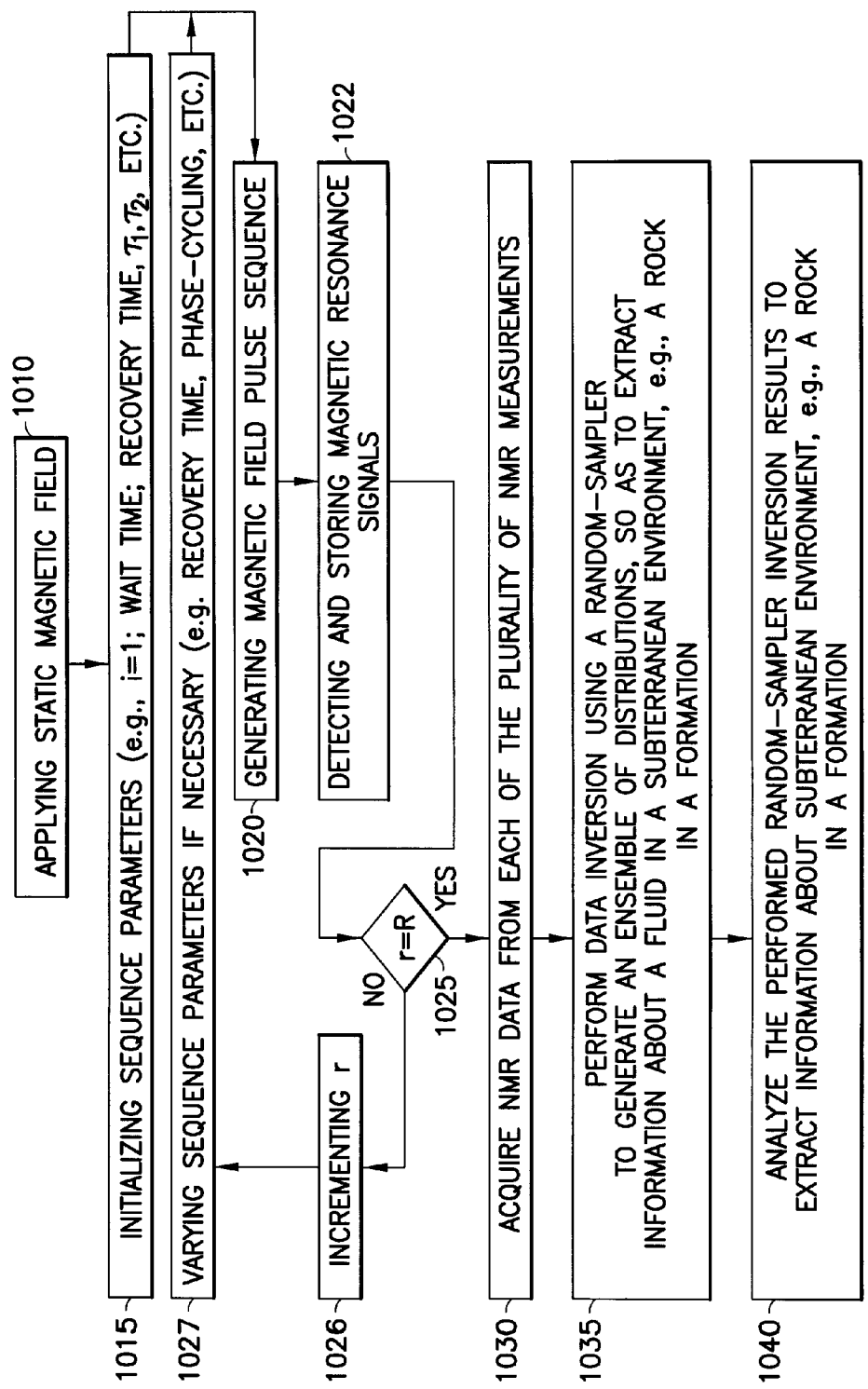
FIG. 10 illustrates a routine that may be used in implementing at least one embodiment of a method of the invention.

FIG. 10 shows methods of the invention that may be implemented in well logging using any nuclear magnetic resonance (NMR) well logging apparatus known in the art. Embodiments of the invention may be implemented with NMR well logging devices without the need for hardware modifications. Further, FIG. 10 shows a flow diagram of a routine that can be used in programming a processor in implementing certain embodiments of the invention. The routine may be stored on or provided over a computer or machine readable medium, such as read-only memory (ROM); random access memory (RAM); magnetic disc or tape; a CD-ROM or other optical storage media; electrical, optical, acoustical or other forms of propagated signals; and the like. The processor may be a downhole processor, an uphole processor, or a combination thereof. The processor also may include a remote processor that may be used for implementing some of the data inversion and interpretation parts of the routine.

Prior to the beginning of the programmed routine and as shown at 1010, a static magnetic field is applied to a region of investigation within an earth formation surrounding a borehole. Theoretically, the earth's magnetic field could be used as the static magnetic field. For most practical purposes, however, this is not preferred. The static magnetic field and field gradient (when desired) typically are applied using a logging tool having a permanent magnet or an array of permanent magnets.

The programmed routine begins at block 1015, which represents initializing parameters for the magnetic field pulse sequence. The sequence parameters may include, for example, i=1, a recovery time, a wait time, $\tau_1$, $\tau_2$, etc., depending on the pulse sequence to be applied. In some embodiments, phase-cycling instructions also may be introduced into the programmed routine at 1015. Generating a magnetic field pulse sequence in the region of investigation is represented by block 1020. Magnetic resonance signals from the region of investigation are detected in block 1022 and stored.

Some embodiments of the invention involve repeatedly applying the magnetic field pulse sequence, or involve applying a plurality of magnetic field pulse sequences. A parameter R may be used (set, perhaps, at block 1015) to indicate a total number of magnetic field pulse sequences to be generated and applied. Decision block 1025 represents querying whether a counter, r, equals R. If no, then r is incremented, as represented in block 1026, and, if necessary, sequence parameters, such as recovery time or phase-cycling instructions, are varied as represented in block 1027, before the routine is returned to block 1020 where the next sequence is generated in the region of investigation. If r=R when queried at decision block 1025, then the data acquisition for the measurement is complete and the routine continues on to block 1030 where the data inversion begins. Depending on the particular NMR measurement being performed, more than one counters and more than one iterative loop may be required.

The Decision block 1030 represents acquiring NMR data from each of the plurality of NMR measurements. Decision block 1035 represents performing data inversion using a random-sampler as describe above, to generate an ensemble of spectra, so as to extract information about a fluid in a subterranean environment, e.g., a rock in a formation. Finally, Decision block 1040 represents analyzing the performed random-sampler inversion results to extract information about subterranean environment, e.g., a rock in a formation.

Whereas many alterations and modifications of the present invention will no doubt become apparent to a person of ordinary skill in the art after having read the foregoing description, it is to be understood that the particular embodiments shown and described by way of illustration are in no way intended to be considered limiting. For example, methods of the invention allow information about a system of nuclear spins, such as in a fluid in a rock or the like, to be extracted, either in a laboratory setting or in well-logging applications, e.g., oilfield applications. Some embodiments may be used to extract two-dimensional maps of parameters of interest, such as $T_1$ and $T_2$, $T_1/T_2$ and $T_2$, D and $T_2$, etc., which may prove useful in distinguishing between fluids and/or between different pore environments within a rock. Further, the invention has been described with reference to particular preferred embodiments, but variations within the spirit and scope of the invention will occur to those skilled in the art. It is noted that the foregoing examples have been provided merely for the purpose of explanation and are in no way to be construed as limiting of the present invention. While the present invention has been described with reference to an exemplary embodiment, it is understood that the words, which have been used herein, are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A method that determines a property of a substance, the method comprising:
    a) performing a plurality of NMR measurements on the substance using a nuclear magnetic resonance (NMR) apparatus in order to acquire NMR data;
    b) performing data inversion on the acquired NMR data using a random-sampler in order to generate an ensemble of NMR parameter spectra, wherein each NMR parameter spectrum within the ensemble of NMR parameter spectra is a solution that is consistent with the acquired NMR data; and
    c) determining both the property of the substance and an error associated with the property of the substance by analyzing the generated ensemble of NMR parameter spectra.

2. The method of claim 1, wherein the acquired NMR data comprises NMR spin echoes.

3. The method of claim 1, wherein the acquired NMR data from each of the plurality of NMR measurements are expressed as
$M_r(\tau_1,\tau_2) \iint k(\tau_1,\tau_2,x,y) f_r(x,y) dx dy + E_r(\tau_1,\tau_2)$, where $M_r(\tau_1,\tau_2)$ represents the acquired NMR data; k represents the kernel function; $\tau_1$ and $\tau_2$ are first and second experimental parameters, respectively, associated with the NMR measurement; x and y are parameters related to the system of spins; $f_r(x,y)$ is a joint probability density function of x and y; and $E_r(\tau_1,\tau_2)$ represents noise associated with the acquired NMR data.

4. The method of claim 3, further comprising discretizing the acquired NMR data and expressing the acquired NMR data as M=KF+E, where matrices K contain entries corresponding to k, respectively, and F and E represent discretized versions of $f_r(x,y)$ and $E_r(\tau_1,\tau_2)$.

5. The method of claim 1, wherein the random-sampler is a Monte Carlo sampler.

6. The method of claim 1, wherein the property of the substance includes one or more characteristics of a fluid in communication with a formation.

7. The method of claim 6, wherein the generated ensemble of NMR parameter spectra includes two or more NMR parameter spectra, such that the one or more characteristics of the fluid are calculated from each spectrum of the two or more NMR parameter spectra.

8. The method of claim 1, wherein analyzing the ensemble of NMR parameter spectra comprises determining at least one of a porosity function, a bound fluid function, and an unbound fluid function associated with the NMR data.

9. The method of claim 1, wherein analyzing the ensemble of NMR parameter spectra comprises determining at least one of an oil saturation function and a log-mean $T_2$ function associated with the NMR data.

10. The method of claim 1, wherein the acquired NMR data is one of one-dimensional (1D), two-dimensional (2D), or multi-dimensional NMR data.

11. A method that determines a property of a formation, the method comprising:
    a) applying a sequence of magnetic field pulses to the formation using a magnetic resonance apparatus, wherein the sequence is described by at least two parameters and each parameter includes two or more settings;
    b) detecting magnetic resonance signals for each of the two or more settings for each parameter data using the magnetic resonance apparatus in order to acquire magnetic resonance;
    c) performing data inversion on the acquired magnetic resonance data using a random-sampler in order to generate an ensemble of magnetic resonance spectra, wherein each magnetic resonance spectrum within the ensemble of magnetic resonance spectra is a solution that is consistent with the acquired magnetic resonance data; and d) determining both the property of the formation and an error associated with the property by analyzing the generated ensemble of magnetic resonance spectra, wherein the property of the formation comprises at least one of (i) a petrophysical property of the formation and (ii) a fluid property of a fluid within the formation.

12. The method of claim 11, further comprising repeating steps a) through d) and incorporating at least one different setting from the two or more parameter settings for at least one parameter of the at least two parameters.

13. The method of claim 11, wherein a first parameter of the at least two parameters comprises a longitudinal relaxation time associated with the fluid within the formation.

14. The method of claim 11, wherein the first parameter comprises a transverse relaxation time associated with the fluid within the formation.

15. The method of claim 11, wherein the first parameter comprises a diffusion sensitive parameter whereby diffusion is determinable.

16. The method of claim 11, wherein a second parameter of the at least two parameters comprises a longitudinal relaxation time associated with the fluid within the formation.

17. The method of claim 11, wherein the second parameter comprises a transverse relaxation time associated with the fluid within the formation.

18. The method of claim 11, wherein the second parameter comprises a diffusion sensitive parameter whereby diffusion is determinable.

19. The method of claim 11, wherein analyzing the generated ensemble of magnetic resonance spectra comprises determining at least one of a porosity function, a bound fluid function, and a unbound fluid function associated with the acquired magnetic resonance data.

20. The method of claim 11, wherein analyzing the generated ensemble of magnetic resonance spectra comprises determining at least one of an oil saturation function and a log-mean $T_2$ function associated with the acquired magnetic resonance.

21. The method of claim 11, wherein the acquired magnetic resonance data is one of one dimensional (1D), two dimensional (2D), or multi-dimensional NMR data.

22. A logging tool that is moveable through a borehole, the logging tool comprising:
    a nuclear magnetic resonance (NMR) apparatus configured to (i) perform a plurality of NMR measurements on at least one region of investigation within a formation surrounding the borehole and (ii) acquire NMR data from each of the plurality of NMR measurements; and
    a processor coupled with the logging tool, the processor being programmed with instructions which, when executed by the processor, cause the processor to:
        (a) perform data inversion on the acquired NMR data using a random-sampler in order to generate an ensemble of NMR parameter spectra, wherein each NMR parameter spectrum within the ensemble of NMR parameter spectra is a solution that is consistent with the acquired NMR data; and
        (b) determine both a property of the at least one region of investigation, within the formation surrounding the borehole, and an error associated with the property, by analyzing the generated ensemble of NMR parameter spectra, wherein the property of the at least one region of investigation within the formation comprises at least one of (i) a petrophysical property of the formation and (ii) a fluid property of a fluid within the formation.

23. The apparatus of claim 22, wherein acquiring NMR data is in real time.

24. The apparatus of claim 22, wherein the results of the data inversion are communicated to a earth surface in real time or stored in the logging tool for later communication.

25. The apparatus of claim 22, wherein the acquired NMR data is one of one dimensional (1D), two dimensional (2D), or multi-dimensional NMR data.

26. The apparatus of claim 22, wherein analyzing the generated ensemble of NMR parameter spectra comprises determining at least one of a total porosity function and a fractional porosity function associated with the acquired NMR data.

* * * * *